US010567008B2

(12) United States Patent
Hussain et al.

(10) Patent No.: US 10,567,008 B2
(45) Date of Patent: Feb. 18, 2020

(54) STOPPING CRITERIA FOR TURBO DECODER

(71) Applicant: Apple Inc., Cupertino, CA (US)

(72) Inventors: Awais M. Hussain, Milpitas, CA (US); Tarik Tabet, Los Gatos, CA (US); Moustafa M. Elsayed, Los Gatos, CA (US)

(73) Assignee: Apple Inc., Cupertino, CA (US)

( * ) Notice: Subject to any disclaimer, the term of this patent is extended or adjusted under 35 U.S.C. 154(b) by 377 days.

(21) Appl. No.: 15/174,413

(22) Filed: Jun. 6, 2016

(65) Prior Publication Data

US 2017/0005674 A1 Jan. 5, 2017

Related U.S. Application Data

(60) Provisional application No. 62/188,215, filed on Jul. 2, 2015.

(51) Int. Cl.
| | | |
|---|---|---|
| *H03M 13/11* | (2006.01) | |
| *H03M 13/29* | (2006.01) | |
| *H04L 1/00* | (2006.01) | |
| *H04B 17/336* | (2015.01) | |
| *H04W 88/02* | (2009.01) | |
| *H03M 13/09* | (2006.01) | |

(52) U.S. Cl.
CPC ...... *H03M 13/2975* (2013.01); *H04B 17/336* (2015.01); *H04L 1/0045* (2013.01); *H03M 13/09* (2013.01); *H03M 13/1128* (2013.01); *H04W 88/02* (2013.01)

(58) Field of Classification Search
CPC ... H04L 1/0009; H04L 1/0057; H04L 1/0041; H04L 1/0071; H04L 1/0045; H03M 13/35; H03M 13/2975; H03M 13/1128; H03M 13/09; H04B 17/336; H04W 88/02
USPC .......................................................... 714/774
See application file for complete search history.

(56) References Cited

U.S. PATENT DOCUMENTS

| 7,093,180 B2 | 8/2006 | Shin et al. |
| 7,454,684 B2 | 11/2008 | Allpress |

(Continued)

OTHER PUBLICATIONS

Joachim Hagenauer; "The EXIT Chart—Introduction to Extrinsic Information Transfer in Iterative Processing"; IEEE 2004 12th European Signal Processing Conference; Sep. 6-10, 2004; eight pages.

(Continued)

*Primary Examiner* — Albert Decady
*Assistant Examiner* — Enam Ahmed
(74) *Attorney, Agent, or Firm* — Kowert Hood Munyon Rankin and Goetzel PC; Jeffrey C. Hood

(57) ABSTRACT

This disclosure relates to providing negative stopping criteria for turbo decoding for a wireless device. A device may wirelessly receive turbo coded data. Turbo decoding may be performed on the turbo coded data. Performing turbo decoding may use one or more negative stopping criteria for early termination of the turbo decoding for each code block of the turbo coded data. The negative stopping criteria may be selected to terminate the turbo decoding of a code block early under poor wireless medium conditions. Turbo decoding of a code block may be terminated early if the one or more negative stopping criteria for the code block are met.

20 Claims, 9 Drawing Sheets

(56) References Cited

U.S. PATENT DOCUMENTS

| | | | |
|---|---|---|---|
| 7,992,073 B2* | 8/2011 | Orio | H03M 13/2975 714/752 |
| 8,316,272 B2* | 11/2012 | Gunnam | H03M 13/1111 714/752 |
| 8,443,253 B2* | 5/2013 | Imafuku | H03M 13/276 714/755 |
| 8,707,146 B2 | 4/2014 | Charpentier et al. | |
| 8,909,949 B2* | 12/2014 | Amador | G06F 1/3228 455/522 |
| 8,984,377 B2* | 3/2015 | Lin | H03M 13/2975 714/774 |
| 2001/0004761 A1* | 6/2001 | Zehavi | H04L 1/0041 714/784 |
| 2003/0126551 A1* | 7/2003 | Mantha | H03M 13/1102 714/790 |
| 2006/0268929 A1* | 11/2006 | Lai | H04L 1/005 370/465 |
| 2006/0270369 A1* | 11/2006 | Hahm | H03M 13/2975 455/130 |
| 2007/0110095 A1* | 5/2007 | Attar | H04L 1/0051 370/458 |
| 2010/0158161 A1* | 6/2010 | Sambhwani | H03M 13/2957 375/341 |
| 2013/0007571 A1* | 1/2013 | Li | H04L 1/005 714/795 |

OTHER PUBLICATIONS

Stephan ten Brink: "Convergence Behavior of Iteratively Decoded Parallel Concatenated Codes": IEEE Trans. On Comm.; vol. 49, No. 10; Oct. 2001; pp. 1727-1737.

Technical Specification 3GPP TS 36.212 Version 12.4.0 Release 12; ETSI TS 136 212 V12.4.0; Apr. 2015; 96 pages.

Silvio A. Abrantes; "From BCJR to Turbo Decoding: MAP algorithms made easier"; Apr. 2004; 30 pages; University de Portugal.

J. Vogt and A. Finger; "Improving the Max-Log-MAP Turbo Decoder"; (IET) Electronics Letters, vol. 36, No. 23; Nov. 9, 2000; pp. 1937-1939.

* cited by examiner

| 1. $SINR_{C+}$ | %BLER | $E\{K\}$ |
|---|---|---|
| P-5 | 3.6 | 5.1 |
| P-16 | 0 | 5.1 |
| P-N-16 | ~0 | 5.1 |

~ 1102

| 2. $SINR_C$ | %BLER | $E\{K\}$ |
|---|---|---|
| P-5 | 100 | 5.5 |
| P-16 | 18.3 | 12 |
| P-N-16 | 27.2 | 9.5 |
| P-100 | 5 | 17.95 |

~ 1104

| 3. $SINR_{C-}$ | %BLER | $E\{K\}$ |
|---|---|---|
| P-5 | 100 | 5.5 |
| P-16 | 100 | 16.5 |
| P-N-16 | 100 | 5.5 |

STOPPING CRITERIA FOR TURBO DECODER

PRIORITY INFORMATION

This application claims priority to U.S. provisional patent application Ser. No. 62/188,215, entitled "Stopping Criteria for Turbo Decoder," filed Jul. 2, 2015, which is hereby incorporated by reference in its entirety as though fully and completely set forth herein.

FIELD

The present application relates to wireless devices, including to systems, apparatuses, and methods for wireless devices to determine when to stop turbo decoding.

DESCRIPTION OF THE RELATED ART

Wireless communication systems are rapidly growing in usage. Additionally, there exist numerous different wireless communication technologies and standards. Some examples of wireless communication technologies include GSM, UMTS (associated with, for example, WCDMA or TD-SCDMA air interfaces), LTE, LTE Advanced (LTE-A), HSPA, 3GPP2 CDMA2000 (e.g., 1xRTT, 1xEV-DO, HRPD, eHRPD), IEEE 802.11 (WLAN or Wi-Fi), IEEE 802.16 (WiMAX), Bluetooth, and others.

Due to the possibility that errors could be introduced when communicating over a wireless communication medium, forward error correction techniques are often used in conjunction with wireless communication medium. Numerous types of forward error correction coding exist, including various subcategories of block coding and convolutional coding techniques. Turbo coding is one example of a forward error correction coding technique that can be used in conjunction with wireless communication.

SUMMARY

Embodiments are presented herein of apparatuses, systems, and methods for determining when to stop performing turbo decoding of a code block.

Turbo encoding and decoding may be used in modems and other equipment to provide forward error correction when sending and receiving data. For example, before transmitting data, a transmitter may perform turbo encoding on blocks (called code blocks) of the data to be transmitted, such that after encoding a data block the resulting "coded block" includes the information bits as well as parity bits. The receiver of the data may then perform turbo decoding on the received data to retrieve the information bits. Turbo encoding/decoding may be a parallel iterative technique, and as such there may be multiple sets of parity bits in a turbo coded code block, for example including a set of parity bits for each constituent encoder/decoder. Each consituent decoder may process the information bits and the parity bits meant for it over a number of passes or iterations. Once a criterion for stopping turbo decoding is satisfied, the iterations may be stopped.

One possible type of criterion may generally include a positive stopping criterion. For example, if it can be determined that the information bits have been correctly decoded, this may serve as a positive stopping criterion, since the goal of the decoding may be to obtain correctly decoded data.

Another possible type of stopping criterion may include a maximum duration (e.g., a maximum number of iterations). In at least some implementations, design constraints may functionally limit the number of iterations that are reasonable to perform, for example depending on the speed at which iterations can be performed and the data rate at which data is being received and needs to be decoded. Thus in such cases, if the maximum number of iterations is reached, the receiver may cease performing turbo decoding, regardless of whether the data has been successfully decoded.

Yet another possible type of criterion may include a negative stopping criterion. For example, if it can be determined that turbo decoding is unlikely to ever converge to provide correctly decoded data (such as if the propagation medium on which the data was transmitted introduced too many errors for the forward error correction provided by the turbo coding to correct), this may serve as one possible negative stopping criterion. Preventing any further iterations once such a determination is made may for example reduce power consumption at the receiver, potentially without causing any performance degradation.

Introducing a negative stopping criterion for turbo decoding may be useful in many scenarios. As one such possible scenario, a link budget limited device in a wireless communication system may be able to benefit substantially from use of a negative stopping criterion. For example, since link budget limited devices may commonly experience poor signal propagation conditions, the power conservation benefits from terminating attempts to decode code blocks with very low probability of successful decoding early may be substantial. Additionally, with a negative stopping criterion in place to prevent excessive power consumption from attempting to decode code blocks with very low probability of successful decoding, it may be possible to allow a greater maximum number of iterations, which may in turn increase the probability (e.g., at a cost of a greater number of iterations) of successfully decoding code blocks with moderate probability of successful decoding, such as might be received if the device is experiencing marginal signal propagation conditions.

Accordingly, techniques are presented herein for a wireless device to implement at least one negative stopping criterion when performing turbo decoding. At least in some instances, the negative stopping criterion (or criteria) may be selected such that early termination of turbo decoding iterations tends to occur under poor wireless medium conditions (such as when signal to noise ratio (SNR) and/or signal to interference plus noise ratio (SINR) are poor).

The techniques described herein may be implemented in and/or used with a number of different types of devices, including but not limited to cellular phones, tablet computers, wearable computing devices, portable media players, storage systems, and any of various other computing devices.

Although the discussion may be phrased in terms of wireless systems using turbo codes, the disclosure may be applicable to a broader class of decoding/detection problems that use the 'Turbo principle,' Notably, in some embodiments the methods described herein may be used in conjunction with another class of forward error correcting codes called the 'low density parity codes (LDPC)' when the LDPC decoder is implemented in a Turbo like architecture. Furthermore, the methods may also or alternatively be used in conjunction with wired communications systems, at least in some embodiments.

This Summary is intended to provide a brief overview of some of the subject matter described in this document. Accordingly, it will be appreciated that the above-described features are merely examples and should not be construed to narrow the scope or spirit of the subject matter described herein in any way. Other features, aspects, and advantages of the subject matter described herein will become apparent from the following Detailed Description, Figures, and Claims.

BRIEF DESCRIPTION OF THE DRAWINGS

A better understanding of the present subject matter can be obtained when the following detailed description of the embodiments is considered in conjunction with the following drawings, in which:

FIG. 11 includes tables illustrating exemplary design test results for several turbo decoding techniques with different stopping criteria under several possible propagation medium conditions.

Figure 1:
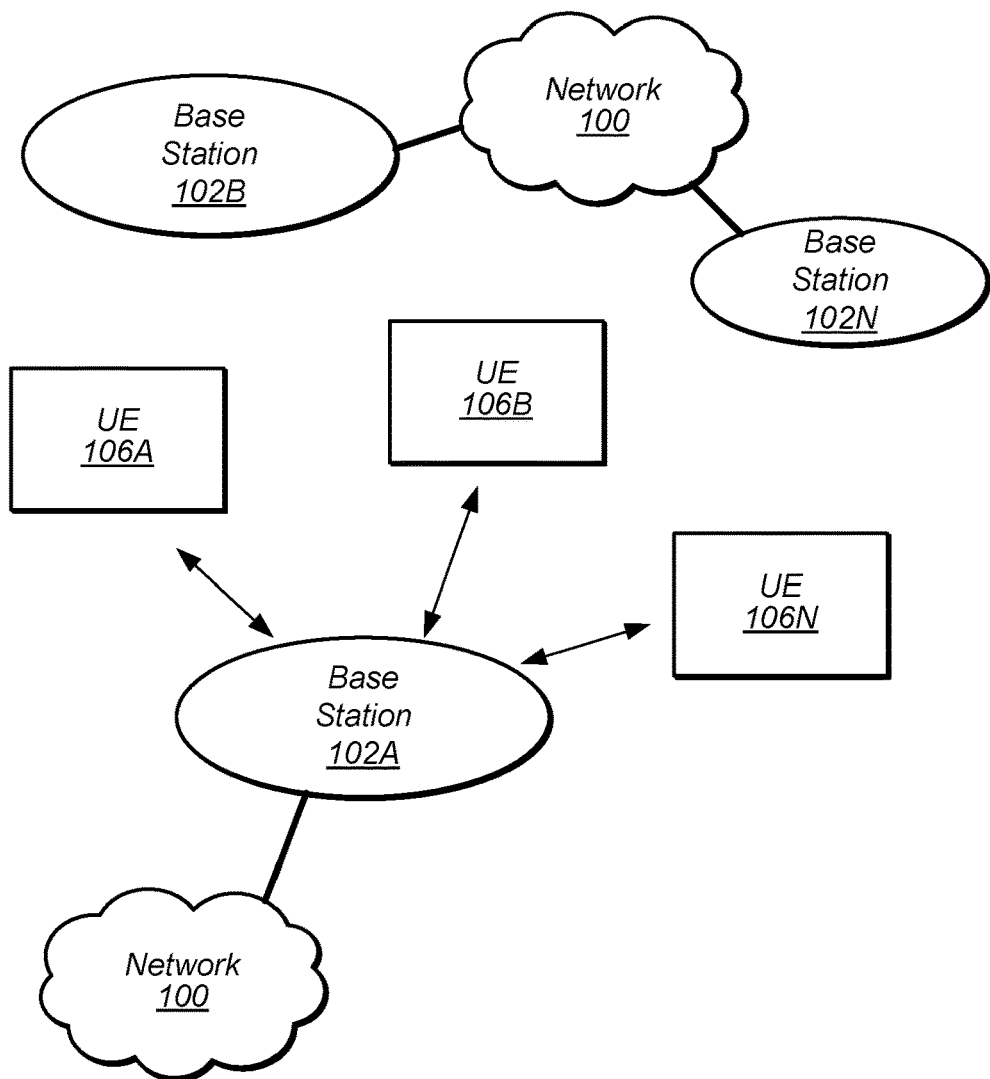
FIG. 1 illustrates an exemplary (and simplified) wireless communication system, according to some embodiments.

While the features described herein may be susceptible to various modifications and alternative forms, specific embodiments thereof are shown by way of example in the drawings and are herein described in detail. It should be understood, however, that the drawings and detailed description thereto are not intended to be limiting to the particular form disclosed, but on the contrary, the intention is to cover all modifications, equivalents and alternatives falling within the spirit and scope of the subject matter as defined by the appended claims.

INCORPORATION BY REFERENCE

The following are incorporated by reference in their entirety as though fully and completely set forth herein:

J. Hagenauer, "The EXIT Chart—Introduction to extrinsic information transfer in iterative processing," IEEE 2004 12th European Signal Processing Conference.

S. Brink, "Convergence behavior of iteratively decoded parallel concatenated codes," IEEE Trans. on Comm., Vol 49, October 2001.

3GPP LTE TS 36.212.

S. Abrantes, "From BCJR to Turbo Decoding: MAP algorithms made easier," 2004, University de Portugal J. Vogt and A. Finger, "Improving the Max-Log-MAP Turbo Decoder," (IET) Electronics Letters, Vol. 36, 2000.

DETAILED DESCRIPTION

Terms

The following is a glossary of terms used in this disclosure:

Memory Medium—Any of various types of non-transitory memory devices or storage devices. The term "memory medium" is intended to include an installation medium, e.g., a CD-ROM, floppy disks, or tape device; a computer system memory or random access memory such as DRAM, DDR RAM, SRAM, EDO RAM, Rambus RAM, etc.; a non-volatile memory such as a Flash, magnetic media, e.g., a hard drive, or optical storage; registers, or other similar types of memory elements, etc. The memory medium may include other types of non-transitory memory as well or combinations thereof. In addition, the memory medium may be located in a first computer system in which the programs are executed, or may be located in a second different computer system which connects to the first computer system over a network, such as the Internet. In the latter instance, the second computer system may provide program instructions to the first computer for execution. The term "memory medium" may include two or more memory mediums which may reside in different locations, e.g., in different computer systems that are connected over a network. The memory medium may store program instructions (e.g., embodied as computer programs) that may be executed by one or more processors.

Carrier Medium—a memory medium as described above, as well as a physical transmission medium, such as a bus, network, and/or other physical transmission medium that conveys signals such as electrical, electromagnetic, or digital signals.

Programmable Hardware Element—includes various hardware devices comprising multiple programmable function blocks connected via a programmable interconnect. Examples include FPGAs (Field Programmable Gate Arrays), PLDs (Programmable Logic Devices), FPOAs (Field Programmable Object Arrays), and CPLDs (Complex PLDs). The programmable function blocks may range from fine grained (combinatorial logic or look up tables) to coarse grained (arithmetic logic units or processor cores). A programmable hardware element may also be referred to as "reconfigurable logic".

Computer System—any of various types of computing or processing systems, including a personal computer system (PC), mainframe computer system, workstation, network appliance, Internet appliance, personal digital assistant (PDA), television system, grid computing system, or other device or combinations of devices. In general, the term "computer system" can be broadly defined to encompass any device (or combination of devices) having at least one processor that executes instructions from a memory medium.

User Equipment (UE) (or "UE Device")—any of various types of computer systems devices which are mobile or portable and which performs wireless communications. Examples of UE devices include mobile telephones or smart phones (e.g., iPhone™, Android™-based phones), portable gaming devices (e.g., Nintendo DS™, Play Station Portable™, Gameboy Advance™, iPhone™), laptops, wearable devices (e.g., smart watch, smart glasses), PDAs, portable Internet devices, music players, data storage devices, or other handheld devices, etc. In general, the term "UE" or "UE device" can be broadly defined to encompass any electronic, computing, and/or telecommunications device (or combination of devices) which is easily transported by a user and capable of wireless communication.

Wireless Device—any of various types of computer system devices which performs wireless communications. A wireless device can be portable (or mobile) or may be stationary or fixed at a certain location. A UE is an example of a wireless device.

Communication Device—any of various types of computer systems or devices that perform communications, where the communications can be wired or wireless. A communication device can be portable (or mobile) or may be stationary or fixed at a certain location. A wireless device is an example of a communication device. A UE is another example of a communication device.

Base Station—The term "Base Station" has the full breadth of its ordinary meaning, and at least includes a wireless communication station installed at a fixed location and used to communicate as part of a wireless telephone system or radio system.

Link Budget Limited—includes the full breadth of its ordinary meaning, and at least includes a characteristic of a wireless device (a UE) which exhibits limited communication capabilities, or limited power, relative to a device that is not link budget limited, or relative to devices for which a radio access technology (RAT) standard has been developed. A UE that is link budget limited may experience relatively limited reception and/or transmission capabilities, which may be due to one or more factors such as device design, device size, battery size, antenna size or design, transmit power, receive power, current transmission medium conditions, and/or other factors. Such devices may be referred to herein as "link budget limited" (or "link budget constrained") devices. A device may be inherently link budget limited due to its size, battery power, and/or transmit/receive power. For example, a smart watch that is communicating over LTE or LTE-A with a base station may be inherently link budget limited due to its reduced transmit/receive power and/or reduced antenna. Wearable devices, such as smart watches, are generally link budget limited devices. Alternatively, a device may not be inherently link budget limited, e.g., may have sufficient size, battery power, and/or transmit/receive power for normal communications over LTE or LTE-A, but may be temporarily link budget limited due to current communication conditions, e.g., a smart phone being at the edge of a cell, etc. It is noted that the term "link budget limited" includes or encompasses power limitations, and thus a power limited device may be considered a link budget limited device.

Processing Element (or Processor)—refers to various elements or combinations of elements. Processing elements include, for example, circuits such as an ASIC (Application Specific Integrated Circuit), portions or circuits of individual processor cores, entire processor cores, individual processors, programmable hardware devices such as a field programmable gate array (FPGA), and/or larger portions of systems that include multiple processors.

Channel—a medium used to convey information from a sender (transmitter) to a receiver. It should be noted that since characteristics of the term "channel" may differ according to different wireless protocols, the term "channel" as used herein may be considered as being used in a manner that is consistent with the standard of the type of device with reference to which the term is used. In some standards, channel widths may be variable (e.g., depending on device capability, band conditions, etc.). For example, LTE may support scalable channel bandwidths from 1.4 MHz to 20 MHz. In contrast, WLAN channels may be 22 MHz wide while Bluetooth channels may be 1 Mhz wide. Other protocols and standards may include different definitions of channels. Furthermore, some standards may define and use multiple types of channels, e.g., different channels for uplink or downlink and/or different channels for different uses such as data, control information, etc.

Band—The term "band" has the full breadth of its ordinary meaning, and at least includes a section of spectrum (e.g., radio frequency spectrum) in which channels are used or set aside for the same purpose.

Automatically—refers to an action or operation performed by a computer system (e.g., software executed by the computer system) or device (e.g., circuitry, programmable hardware elements, ASICs, etc.), without user input directly specifying or performing the action or operation. Thus the term "automatically" is in contrast to an operation being manually performed or specified by the user, where the user provides input to directly perform the operation. An automatic procedure may be initiated by input provided by the user, but the subsequent actions that are performed "automatically" are not specified by the user, i.e., are not performed "manually", where the user specifies each action to perform. For example, a user filling out an electronic form by selecting each field and providing input specifying information (e.g., by typing information, selecting check boxes, radio selections, etc.) is filling out the form manually, even though the computer system must update the form in response to the user actions. The form may be automatically filled out by the computer system where the computer system (e.g., software executing on the computer system) analyzes the fields of the form and fills in the form without any user input specifying the answers to the fields. As indicated above, the user may invoke the automatic filling of the form, but is not involved in the actual filling of the form (e.g., the user is not manually specifying answers to fields but rather they are being automatically completed). The present specification provides various examples of operations being automatically performed in response to actions the user has taken.

Figure 2:
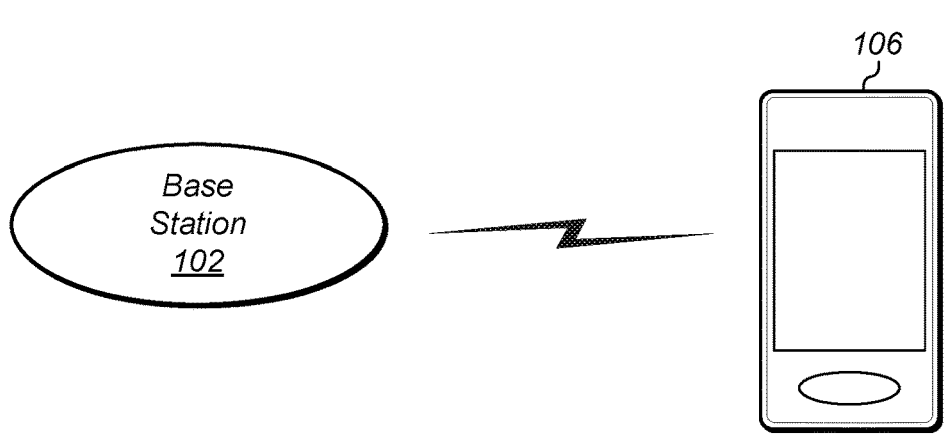
FIG. 2 illustrates a base station (BS) in communication with a user equipment (UE) device, according to some embodiments.

FIGS. 1 and 2—Communication System

FIG. 1 illustrates an exemplary (and simplified) wireless communication system, according to some embodiments. It is noted that the system of FIG. 1 is merely one example of a possible system, and embodiments may be implemented in any of various systems, as desired.

As shown, the exemplary wireless communication system includes a base station 102A which communicates over a transmission medium with one or more user devices 106A, 106B, etc., through 106N. Each of the user devices may be referred to herein as a "user equipment" (UE). Thus, the user devices 106 are referred to as UEs or UE devices.

The base station 102A may be a base transceiver station (BTS) or cell site, and may include hardware that enables wireless communication with the UEs 106A through 106N. The base station 102A may also be equipped to communicate with a network 100 (e.g., a core network of a cellular service provider, a telecommunication network such as a public switched telephone network (PSTN), and/or the Internet, among various possibilities). Thus, the base station 102A may facilitate communication between the user devices and/or between the user devices and the network 100.

The communication area (or coverage area) of the base station may be referred to as a "cell." The base station 102A and the UEs 106 may be configured to communicate over the transmission medium using any of various radio access technologies (RATs), also referred to as wireless communication technologies, or telecommunication standards, such as GSM, UMTS (WCDMA, TD-SCDMA), LTE, LTE-Advanced (LTE-A), HSPA, 3GPP2 CDMA2000 (e.g., 1×RTT, 1×EV-DO, HRPD, eHRPD), Wi-Fi, WiMAX etc.

Base station 102A and other similar base stations (such as base stations 102B . . . 102N) operating according to the same or a different cellular communication standard may thus be provided as a network of cells, which may provide continuous or nearly continuous overlapping service to UEs 106A-N and similar devices over a geographic area via one or more cellular communication standards.

Thus, while base station 102A may act as a "serving cell" for UEs 106A-N as illustrated in FIG. 1, each UE 106 may also be capable of receiving signals from (and possibly within communication range of) one or more other cells (which might be provided by base stations 102B-N and/or any other base stations), which may be referred to as "neighboring cells". Such cells may also be capable of facilitating communication between user devices and/or between user devices and the network 100, according to the same wireless communication technology as base station 102A and/or any of various other possible wireless communication technologies. Such cells may include "macro" cells, "micro" cells, "pico" cells, and/or cells which provide any of various other granularities of service area size. For example, base stations 102A-B illustrated in FIG. 1 might be macro cells, while base station 102N might be a micro cell. Other configurations are also possible.

Note that a UE 106 may be capable of communicating using multiple wireless communication standards. For example, a UE 106 may be configured to communicate using a wireless networking (e.g., Wi-Fi) and/or peer-to-peer wireless communication protocol (e.g., BT, Wi-Fi peer-to-peer, etc.) in addition to at least one cellular communication protocol (e.g., GSM, UMTS (WCDMA, TD-SCDMA), LTE, LTE-A, HSPA, 3GPP2 CDMA2000 (e.g., 1×RTT, 1×EV-DO, HRPD, eHRPD), etc.). The UE 106 may also or alternatively be configured to communicate using one or more global navigational satellite systems (GNSS, e.g., GPS or GLONASS), one or more mobile television broadcasting standards (e.g., ATSC-M/H or DVB-H), and/or any other wireless communication protocol, if desired. Other combinations of wireless communication standards (including more than two wireless communication standards) are also possible.

FIG. 2 illustrates user equipment 106 (e.g., one of the devices 106A through 106N) in communication with a base station 102 (e.g., one of the base stations 102A through 102N), according to some embodiments. The UE 106 may be a device with cellular communication capability such as a mobile phone, a hand-held device, a wearable device, a computer or a tablet, or virtually any type of wireless device.

The UE 106 may include a processor that is configured to execute program instructions stored in memory. The UE 106 may perform any of the method embodiments described herein by executing such stored instructions. Alternatively, or in addition, the UE 106 may include a programmable hardware element such as an FPGA (field-programmable gate array) that is configured to perform any of the method embodiments described herein, or any portion of any of the method embodiments described herein.

The UE 106 may include one or more antennas for communicating using one or more wireless communication protocols or technologies. In some embodiments, the UE 106 might be configured to communicate using either of CDMA2000 (1×RTT/1×EV-DO/HRPD/eHRPD) or LTE using a single shared radio and/or GSM or LTE using the single shared radio. The shared radio may couple to a single antenna, or may couple to multiple antennas (e.g., for MIMO) for performing wireless communications. In general, a radio may include any combination of a baseband processor, analog RF signal processing circuitry (e.g., including filters, mixers, oscillators, amplifiers, etc.), or digital processing circuitry (e.g., for digital modulation as well as other digital processing). Similarly, the radio may implement one or more receive and transmit chains using the aforementioned hardware. For example, the UE 106 may share one or more parts of a receive and/or transmit chain between multiple wireless communication technologies, such as those discussed above.

In some embodiments, the UE 106 may include separate (and possibly multiple) transmit and/or receive chains (e.g., including separate RF and/or digital radio components) for each wireless communication protocol with which it is configured to communicate. As a further possibility, the UE 106 may include one or more radios which are shared between multiple wireless communication protocols, and one or more radios which are used exclusively by a single wireless communication protocol. For example, the UE 106 might include a shared radio for communicating using either of LTE or 1×RTT (or LTE or GSM), and separate radios for communicating using each of Wi-Fi and Bluetooth. Other configurations are also possible.

Figure 3:
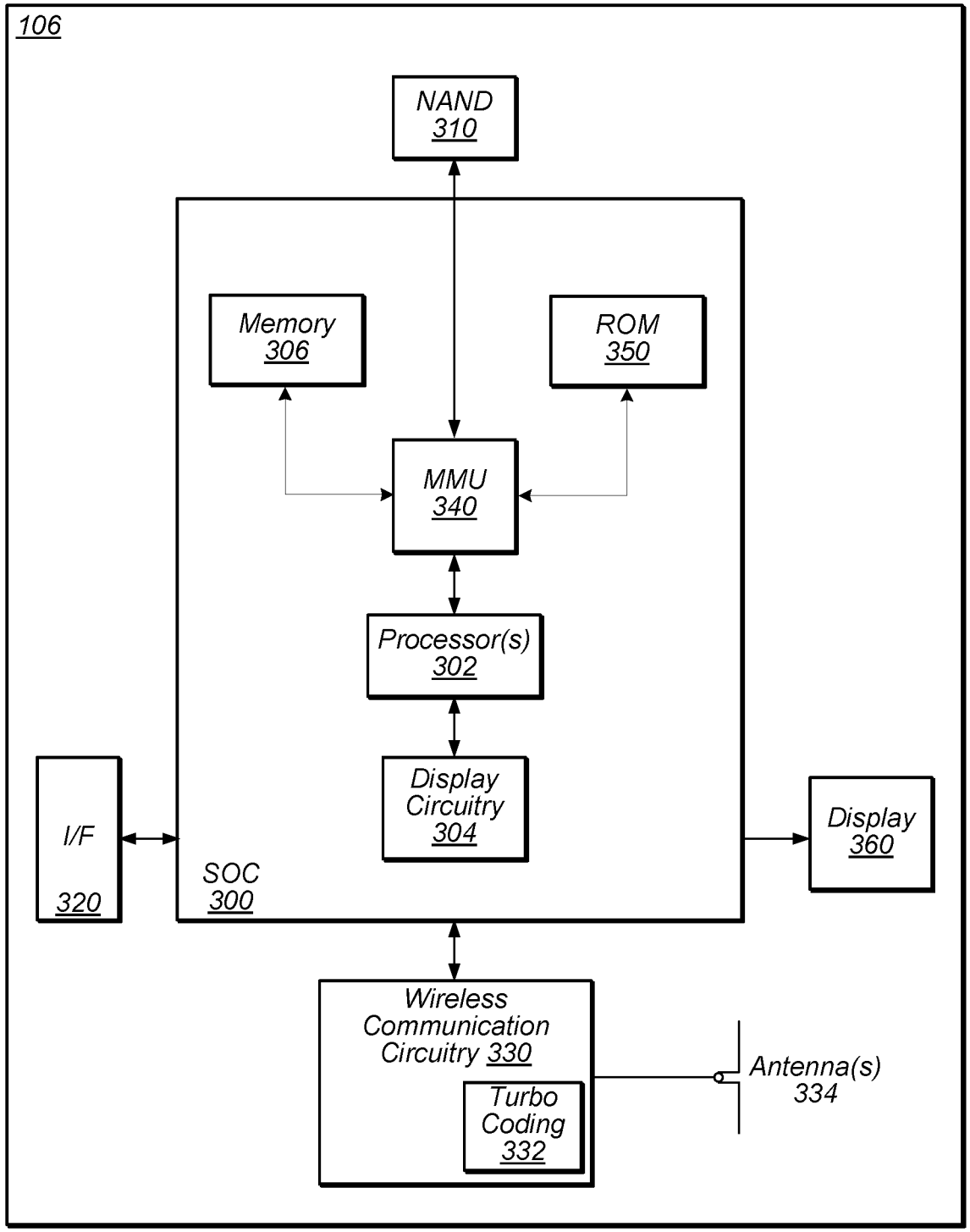
FIG. 3 illustrates an exemplary block diagram of a UE device, according to some embodiments.

FIG. 3—Exemplary Block Diagram of a UE

FIG. 3 illustrates an exemplary block diagram of a UE 106, according to some embodiments. As shown, the UE 106 may include a system on chip (SOC) 300, which may include portions for various purposes. For example, as shown, the SOC 300 may include processor(s) 302 which may execute program instructions for the UE 106 and display circuitry 304 which may perform graphics processing and provide display signals to the display 360. The processor(s) 302 may also be coupled to memory management unit (MMU) 340, which may be configured to receive addresses from the processor(s) 302 and translate those addresses to locations in memory (e.g., memory 306, read only memory (ROM) 350, NAND flash memory 310) and/or to other circuits or devices, such as the display circuitry 304, wireless communication circuitry 330, connector I/F 320, and/or display 360. The MMU 340 may be configured to perform memory protection and page table translation or set up. In some embodiments, the MMU 340 may be included as a portion of the processor(s) 302.

As shown, the SOC 300 may be coupled to various other circuits of the UE 106. For example, the UE 106 may include various types of memory (e.g., including NAND flash 310), a connector interface 320 (e.g., for coupling to a computer system, dock, charging station, etc.), the display 360, and wireless communication circuitry 330 (e.g., for LTE, Wi-Fi, GPS, etc.). At least in some embodiments, the wireless communication circuitry 330 may include a turbo coding and/or decoding module 332, which may include multiple constituent encoders/decoders.

The UE device 106 may include at least one antenna (and possibly multiple antennas, e.g., for MIMO and/or for implementing different wireless communication technologies, among various possibilities), for performing wireless communication with base stations and/or other devices. For example, the UE device 106 may use antenna(s) 334 to perform the wireless communication. As noted above, the UE 106 may be configured to communicate wirelessly using multiple wireless communication technologies in some embodiments.

As described further subsequently herein, the UE 106 may include hardware and software components for implementing features described herein, such as those described herein with reference to, inter alia, FIG. 5. The processor 302 of the UE device 106 may be configured to implement part or all of the methods described herein, e.g., by executing program instructions stored on a memory medium (e.g., a non-transitory computer-readable memory medium). In other embodiments, processor 302 may be configured as a programmable hardware element, such as an FPGA (Field Programmable Gate Array), or as an ASIC (Application Specific Integrated Circuit). Alternatively (or in addition) the processor 302 of the UE device 106, in conjunction with one or more of the other components 300, 304, 306, 310, 320, 330, 332, 334, 340, 350, 360 may be configured to implement part or all of the features described herein, such as the features described herein with reference to, inter alia, FIG. 5.

Figure 4:
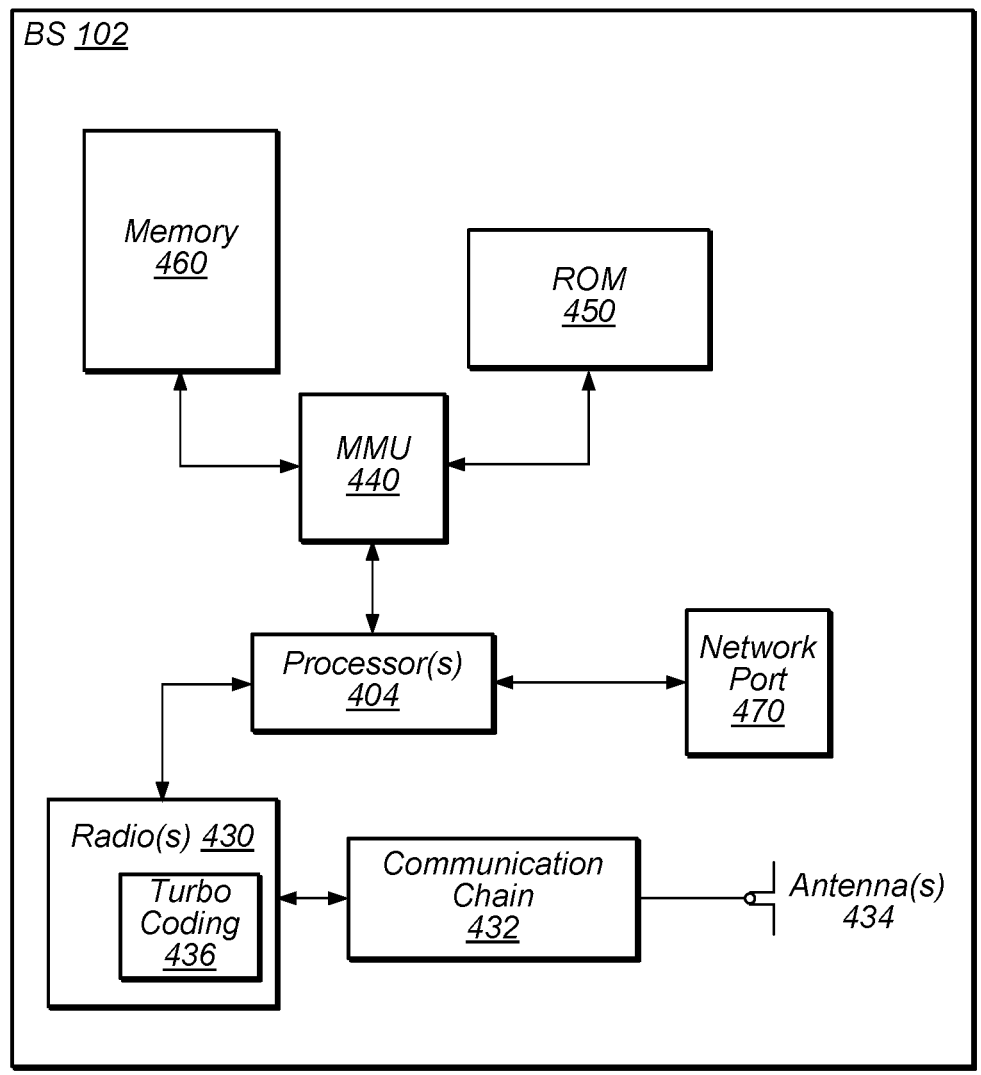
FIG. 4 illustrates an exemplary block diagram of a BS, according to some embodiments.

FIG. 4—Exemplary Block Diagram of a Base Station

FIG. 4 illustrates an exemplary block diagram of a base station 102, according to some embodiments. It is noted that the base station of FIG. 4 is merely one example of a possible base station. As shown, the base station 102 may include processor(s) 404 which may execute program instructions for the base station 102. The processor(s) 404 may also be coupled to memory management unit (MMU) 440, which may be configured to receive addresses from the processor(s) 404 and translate those addresses to locations in memory (e.g., memory 460 and read only memory (ROM) 450) or to other circuits or devices.

The base station 102 may include at least one network port 470. The network port 470 may be configured to couple to a telephone network and provide a plurality of devices, such as UE devices 106, access to the telephone network as described above in FIGS. 1 and 2.

The network port 470 (or an additional network port) may also or alternatively be configured to couple to a cellular network, e.g., a core network of a cellular service provider. The core network may provide mobility related services and/or other services to a plurality of devices, such as UE devices 106. In some cases, the network port 470 may couple to a telephone network via the core network, and/or the core network may provide a telephone network (e.g., among other UE devices serviced by the cellular service provider).

The base station 102 may include at least one antenna 434, and possibly multiple antennas. The antenna(s) 434 may be configured to operate as a wireless transceiver and may be further configured to communicate with UE devices 106 via radio 430. The antenna(s) 434 communicates with the radio 430 via communication chain 432. Communication chain 432 may be a receive chain, a transmit chain or both. The radio 430 may be configured to communicate via various wireless telecommunication standards, including, but not limited to, LTE, LTE-A, UMTS, CDMA2000, Wi-Fi, etc. At least in some embodiments, the radio 430 may include a turbo coding and/or decoding module 436, which may include multiple constituent encoders/decoders.

The BS 102 may be configured to communicate wirelessly using multiple wireless communication standards. In some instances, the base station 102 may include multiple radios, which may enable the base station 102 to communicate according to multiple wireless communication technologies. For example, as one possibility, the base station 102 may include an LTE radio for performing communication according to LTE as well as a Wi-Fi radio for performing communication according to Wi-Fi. In such a case, the base station 102 may be capable of operating as both an LTE base station and a Wi-Fi access point. As another possibility, the base station 102 may include a multi-mode radio which is capable of performing communications according to any of multiple wireless communication technologies (e.g., LTE and Wi-Fi).

Figure 5:
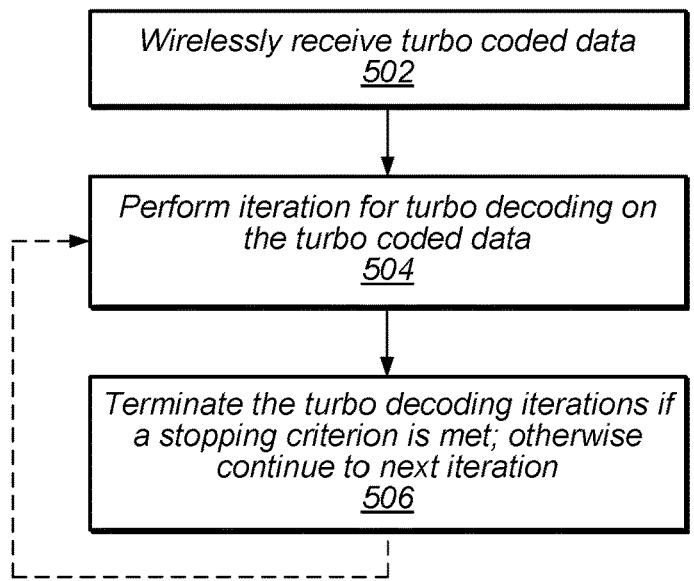
FIG. 5 is a flowchart diagram illustrating an exemplary method for performing turbo decoding, according to some embodiments.

The BS 102 may include hardware and software components for implementing or supporting implementation of features described herein, such as those described herein with reference to, inter alia, FIG. 5. The processor 404 of the base station 102 may be configured to implement part or all of the methods described herein, e.g., by executing program instructions stored on a memory medium (e.g., a non-transitory computer-readable memory medium). Alternatively, the processor 404 may be configured as a programmable hardware element, such as an FPGA (Field Programmable Gate Array), or as an ASIC (Application Specific Integrated Circuit), or a combination thereof. Alternatively (or in addition) the processor 404 of the BS 102, in conjunction with one or more of the other components 430, 432, 434, 436, 440, 450, 460, 470 may be configured to implement or support implementation of part or all of the features described herein, such as the features described herein with reference to, inter alia, FIG. 5.

FIG. 5—Flowchart

As previously noted herein, turbo decoding may be used in modems and other equipment to decode forward-turbo-error-correction encoded code blocks (data). For example, a current version of the 3GPP LTE standard specifies the use of turbo codes for both uplink and downlink communication. At least in some embodiments, the turbo encoded bits for a codeword may contain the information bits, parity bits generated for the first constituent decoder, and parity bits generated for the second constituent decoder. In some instances, puncturing may be used to transmit only a subset of the bits generated by a turbo encoder.

The turbo decoder may function by exchanging "extrinsic information" about the information bits of the code block between two constituent decoders in a number of passes, which may also be referred to as iterations. Each constituent decoder may use the received information bits and the received parity bits intended for that constituent decoder.

In some embodiments, a code block may have a cyclic redundancy check (CRC) appended to the information bits before encoding and transmission. In such a case, at the end of each iteration (or half-iteration), the decoder may be able to compute the CRC from the decoded information bits and check it against the appended CRC. If the CRCs match, the information bits may be assumed to be decoded correctly, and the iterations may be stopped. Thus use of an appended CRC may function as a positive stopping criterion. At least in some instances, for the purposes of encoding/decoding, the CRC may be considered part of the code block.

The turbo decoder may also be configured to spend up to a maximum allotted duration decoding a given code block. For example, in some embodiments, if a maximum number of iterations is reached, the decoder may exit unconditionally. Thus, the use of a positive stopping criterion may allow the decoder to terminate "early" (e.g., prior to the configured maximum duration) and successfully.

In poorer signal propagation medium (e.g., wireless medium) conditions (e.g., lower signal to interference plus noise ratio (SINR) values), allowing a greater number of iterations may increase the probability of successfully decoding a code block. However, in many instances, the maximum number of iterations may be limited by the available resources. For example, the speed and number of turbo decoders available to a device at a particular time, and the rate at which code blocks are being received by the device, may provide a functional limit to the maximum number of iterations that may be performed on any given code block to avoid creating a bottleneck in the device's receive operations.

Additionally, in some scenarios (e.g., at very low SINR values), medium conditions may be so poor that a code block is very unlikely (e.g., has a very low probability) of successful decoding regardless of the number of turbo decoding iterations performed. In such a case, performing a large number of turbo decoding iterations would result in (potentially substantial) power consumption with little or no benefit.

Accordingly, it may in at least some instances be useful to utilize a negative stopping criterion that causes turbo decoding to be terminated "early" (e.g., prior to the configured maximum duration) upon determining that the decoding is unlikely to be successful.

FIG. 5 is a flowchart diagram illustrating a method for performing turbo decoding that uses negative stopping criteria. Note that although the discussion relating to FIG. 5 is phrased in terms of wireless systems using turbo codes, aspects of the disclosure may be applicable to a broader class of decoding/detection problems that use the 'Turbo principle,' some of which are, for example, mentioned in "The EXIT Chart—Introduction to extrinsic information transfer in iterative processing," (incorporated by reference above). Notably the techniques described herein may be valid for another class of forward error correcting codes referred to as low density parity codes (LDPC)', for example when the LDPC decoder is implemented in a Turbo like architecture. Furthermore, the methods may be equally valid for wired communications systems.

The method of FIG. 5 may thus be used in conjunction with any of a variety of wireless communication technologies, including UMTS, LTE, LTE-A, and/or any of various other wireless and/or wired communication technologies, as desired. The method shown in FIG. 5 may be used in conjunction with any of the computer systems or devices shown in the above Figures, among other devices. For example, the method of FIG. 5 may be performed by a UE device (e.g., such as UE 106 illustrated in and described with respect to FIGS. 1-3) or a BS (e.g., such as BS 102 illustrated in and described with respect to FIGS. 1-2 and 4), among various possibilities. In various embodiments, some of the elements of the scheme shown may be performed concurrently, in a different order than shown, substituted for by other elements, or may be omitted. Additional elements may also be performed as desired. As shown, the method may operate as follows.

In 502, turbo coded data may be wirelessly received. The turbo coded data may include one or more code blocks. The turbo coded data may be received via a wireless signal propagation medium (e.g., over the air) via any of a variety of possible wireless communication technologies, from any of a variety of possible wireless communication devices. For example, the turbo coded data may be received from a BS (e.g., by a UE or another BS), or from a UE (e.g., by a BS or another UE), among various possibilities.

In some embodiments, one or both of the transmitting or receiving device may be "link budget limited". Wireless communication can be useful for a wide breadth of device classes, ranging from relatively simple (e.g., potentially inexpensive) devices which may have limited capabilities, to relatively complex (e.g., potentially more expensive) devices which may have greater capabilities. Such devices may have different characteristics with respect to processing, memory, battery, antenna(s) (power/range, directionality), and/or other capabilities. Devices which exhibit relatively limited reception and/or transmission capabilities (due to device design, current transmission medium conditions, and/or other factors) may be referred to in some instances as "link budget limited" or "link budget constrained" devices. In other words, link budget limitations may result from hardware limitations (e.g., power amplifier and/or antenna limitations, lack of receive diversity, etc.) and/or RF conditions (e.g., if a wireless device is at cell edge) that may result in signals from such a device being received with lower signal strength than signals from other devices, at least in some instances. Note that it may be possible for both mobile and fixed devices (e.g., potentially including base stations) to exhibit link budget limitations.

In 504, a turbo decoding iteration may be performed on the turbo coded data. At each half-iteration, a constituent turbo decoder may compute the likelihood ratio of an information bit. The likelihood ratio of an information bit as computed by a constituent turbo decoder may then be considered as a priori likelihood ratio of the information bit by the other constituent turbo decoder for its next iteration. These computed likelihood ratios (which may then serve as a priori likelihood ratios) are called extrinsic information.

The turbo decoding may be subject to one or more stopping criteria and/or a maximum duration. For example, the turbo decoding for each code block may be subject to one or more positive stopping criteria, one or more negative stopping criteria, and a configured maximum number of turbo decoding iterations. Thus, in 506, the turbo decoding iterations may be terminated if a stopping criterion is met. Otherwise, the turbo decoding may continue to the next iteration (e.g., return to step 504). In this way, the turbo decoding may include performing up to a certain number of turbo decoding iterations on each code block of the turbo coded data.

As one possible positive stopping criteria, an appended CRC value for a code block may be compared with a CRC value calculated from the decoded information bits of the code block, and turbo decoding of the code block may be terminated (stopped) early (and successfully) if the CRC values match. In other words, one possible positive stopping criterion might include the decoded information bits of a code block meeting a cyclic redundancy check for the code block.

In some embodiments, one or more negative stopping criteria may use a metric that is based at least in part on computed a priori likelihood ratios of information bits in a code block. For example, a time-averaged, running-average, approximate, filtered, or otherwise determined metric based on such likelihood ratios may be used. As one specific example, an average absolute extrinsic information (AAEXI) metric, such as further described subsequently herein, may be used as a metric as part of one or more negative stopping criteria, if desired.

Such likelihood ratios may be exchanged between constituent turbo decoders every half iteration, so at least in some instances it may be possible to monitor and calculate a value for the metric at each half iteration. If desired, the metric may alternatively be monitored/calculated less frequently. The metric may provide an iteration-dependent measure of the probability of successfully decoding the code block, in some instances.

As one possible negative stopping criterion, if the value of the metric is below a certain threshold after a certain number of turbo decoding iterations, turbo decoding of the code block may be terminated at that time. Note that any number of such iteration dependent negative stopping criteria may be used, as desired; for example, turbo decoding might be terminated early if the value of the metric is below a first threshold after a first number of turbo decoding iterations, or if the value of the metric is below a second threshold after a second number of turbo decoding iterations, etc., using any desired number of thresholds for the metric value and the number of turbo decoding iterations. Note that since the metric may provide an iteration-dependent measure of the probability of successfully decoding the code block, the negative stopping criterion or criteria may also or alternatively be selected to cause stopping of turbo decoding of a code block if probability of successful decoding of the code block is deemed below a predetermined threshold.

As another possible negative stopping criterion, the calculated metric value at a half-iteration may be compared with a variable threshold, where the thresholds are specified for each half-iteration and the iterations terminated early if the value of the metric is below the threshold. The threshold may thus be a function of iteration. This criterion is thus based on metric comparison with absolute thresholds. This criterion contains the criterion described above as a subset.

As another possible negative stopping criterion, at each constituent turbo decoder, the calculated metric value at an iteration may be compared with the calculated metric value at the previous iteration, and the iterations terminated early if the metric value is less than or equal to the value of the metric at the previous iteration. This criterion is thus based on relative metric comparison and expects a monotonic increasing metric. As an additional option, the criterion may be applied only at a selected set of iterations. For example, the criterion may be applied only for iteration greater than some minimum value where the minimum value can be suitably chosen.

Any combination of the conditions in the 'absolute' and 'relative' comparisons for negative stopping criteria described above may be used. This may be considered a composite of the negative stopping criteria described above.

Note also that since the metric may provide an iteration-dependent measure of the probability of successfully decoding the code block, it may be possible to use the metric to determine when to check whether a positive stopping criterion has been met. For example, it may be possible to determine (e.g., based on theory, design testing, and/or some combination thereof, among various possibilities) that below a certain threshold value of the metric, the probability that the positive stopping criterion will be met is very low (e.g., below a certain threshold), and that power may be conserved by refraining from checking whether the positive stopping criterion is met if the metric is below that threshold value. Thus, in some embodiments, the metric may be monitored and when to check whether a positive stopping criterion is met may be selected based at least in part on the value of the metric.

As noted above, turbo decoding may also be stopped if a configured maximum duration (e.g., which may be quantified by number of turbo decoding iterations performed, by time passed, or in any other manner, as desired). For example, if a configured maximum number of turbo decoding iterations have been performed on a code block, turbo decoding of the code block may be terminated at that time regardless of whether another (e.g., positive or negative) stopping criterion has been met.

The stopping criteria and the configured maximum duration of the turbo coding may be selected to cause a duration of the turbo coding of a code block to vary in a manner correlated with wireless medium conditions when receiving the code block. For example, the positive stopping criteria may tend to cause the turbo coding to be terminated early (successfully) in good wireless medium conditions, while the negative stopping criteria may also tend to cause the turbo coding to be terminated early (but unsuccessfully) in poor wireless medium conditions (e.g., since the turbo coding might be unlikely to be successful even if performed for a longer time in such conditions), and the configured maximum duration may be sufficiently large as to tend to cause the turbo coding to have a longer duration in moderate wireless medium conditions than in either good wireless medium conditions or poor wireless medium conditions.

Note that any of various individual metrics or combinations of metrics may be considered as representative of the wireless medium conditions according to various embodiments. As one possibility, a signal to noise ratio (SNR) or signal to noise plus interference ratio (SINR) may be representative of wireless medium conditions. For example, "poor wireless medium conditions" might include a SINR region below a first SINR threshold, while "good wireless medium conditions" might include a SINR region above a second threshold, and "moderate wireless medium conditions" might include a SINR region between the first threshold and the second threshold. Any of various other ways of characterizing different wireless medium conditions may also or alternatively be used.

As previously noted, in some instances a wireless device may be subject to design constraints that cause the device to be link budget limited. As further previously noted, in some instances the design considerations of a wireless device may affect the practical maximum duration for which turbo decoding of a code block is performed. In view of such and other design related considerations, it should also be noted that the stopping criteria (e.g., including any or all of the configured maximum duration of turbo coding per code block, the positive stopping criterion or criteria, and/or the negative stopping criterion or criteria) may also be selected based at least in part on design considerations of the device performing the method of FIG. 5.

Note also that in a scenario where the UE device is link budget limited, such as described above, the desirability of increasing the maximum possible number of turbo iterations may apply not only in the downlink (i.e., when the UE is receiving data) but also in the uplink (i.e., when the UE is transmitting and, for example, a BS is receiving). For example, since transmissions may be expensive for a UE device in terms of power and battery, and a transmission by a UE that is not successfully decoded at the BS may need to be retransmitted by the UE, if the BS receiver can reduce the uplink error rate by selectively allowing a greater maximum number of turbo iterations, this may directly benefit the UE. Thus, in some instances, in the uplink case, the turbo decoder in the BS receiver may use an increased number of maximum turbo iterations for link budget limited UEs and/or UEs experiencing poor wireless conditions. In other words, the device (e.g., BS or UE) implementing the method may dynamically modify one or more of its stopping criteria, e.g., depending on characteristics of the device with which it is communicating and/or wireless medium conditions between the device implementing the method and the device with which it is communicating.

Note that the turbo decoding of each code block may be stopped based on the stopping criterion that applies to that code block independently of each other code block, at least in some instances. Thus, if a positive stopping criterion is met, the turbo decoding of a code block may be terminated successfully, while if a negative stopping criterion is met, the turbo decoding of a code block may be terminated unsuccessfully, and if a configured maximum duration is met, the turbo decoding of a code block may be terminated unsuccessfully (or possibly successfully, if a positive stopping criterion is also met at that time).

Note that once a turbo decoding of a code block is completed (e.g., either successfully as a result of meeting a positive stopping criterion or unsuccessfully as a result of meeting a negative stopping criterion), turbo decoding of another code block may begin. Thus the method may be performed successively to perform turbo decoding of multiple code blocks of turbo coded data, as desired.

FIGS. 6-11—Additional Information

FIGS. 6-11 illustrate various aspects of turbo decoding stopping criteria and considerations relating thereto, such as might be used in conjunction with the method of FIG. 5 according to some embodiments. It should be noted while the exemplary details illustrated in and described with respect to FIGS. 6-11 may be representative of certain features that may be used in conjunction with turbo decoding techniques, other features are also possible. Accordingly, the features of FIGS. 6-11 are not intended to be limiting to the disclosure as a whole: numerous variations and alternatives to the details provided herein below are possible and should be considered within the scope of the disclosure.

For turbo code decoding, it may be possible to identify three SINR regimes: high SINR, critical SINR, and low SINR. Critical SINR may be a range in which some percentage of decoded code-blocks will be in error. In this region, allowing a greater number of iterations will lower the probability of codeblock-error at the expense of higher average number of iterations. In a test environment (or simulation), the SINR may be increased above the critical range until the decodings become virtually error free (e.g., for a given maximum number of iterations $K_+$). This may be denoted $SINR_{C+}$.

The SINR may likewise be lowered below the critical range until the decodings become virtually all in error (e.g., no matter how many iterations are allowed). For specificity's sake, a maximum number of allowed iterations may nonetheless in this case to be denoted as $K_-$. This may be denoted $SINR_{C-}$, and $K_-$ may be selected to be greater than $K_+$.

The critical SINR range may fall between the $SINR_{C+}$ and $SINR_{C-}$ values and may be denoted as $SINR_C$. A representative SINR in the critical region may be identified as the "middle" of this region and may also be denoted by $SINR_C$ in the following discussion. For $SINR_C$, as the number of allowed iterations is increased from $K_+$ to $K_-$, it may be expected that the probability of successful decoding should be non-decreasing.

When using only a positive stopping criterion, for a given Turbo code, one possible strategy may be to identify the critical SINR region and pick a $K_+$ (maximum number of iterations) for error free operation at $SINR_{C+}$.

Selecting a higher value of $K_+$ may allow for reasonable operation some way into the critical SINR region (with some probability of successful decoding). But this may be wasteful of battery power in the low SINR region, as without a negative stopping criterion the maximum number of iterations may always be run in the low SINR region, potentially often without even successfully decoding.

Thus, in such a scenario, it may be important to pick a sensible value for $K_+$ regardless of the turbo decoding resources available in the modem.

For link budget limited modems, the received signal SINR may tend to be poor because of losses in the receiver front-end and path losses. It may thus be desirable to provide the possibility of reasonably operating farther into the critical SINR region and to take advantage of the possible gains offered by higher numbers of turbo iterations.

Note also that some devices (e.g., some machine type communication (MTC) and low-end devices, among various possibilities) may only be capable of operation in a half-duplex frequency division duplexing (FDD) mode. Such a device may have to ignore the last small portion of a downlink transmission time interval (TTI) in order to switch the radio front-end from receive (RX) to transmit (TX) close to the end of a TTI. In this case the redundancy for the received code word may be reduced. This may also be a potential reason to use more turbo iterations, e.g., in an effort to recoup this loss in redundancy.

Additionally, for MTC and low throughput modems (e.g., category 1 in LTE), the amount of data to be decoded in a TTI may typically be relatively low and thus the number of Turbo iterations that are feasible may be much higher than for high-throughput modems.

However, as previously noted, a high maximum number of turbo decoding iterations may waste battery power when the modem is in the low SINR regime or when the effective coding rate is too high if only a positive stopping criterion is used for possible early termination of turbo decoding.

Thus, a negative stopping criteria that will stop the turbo decoding after a few iterations in the low SINR regime (or when coding rate is too high) and will not affect the turbo error rate in the high-SINR regime may be useful in at least some instances; for example, with such a negative stopping criterion in place, it may be the case that the maximum allowed iterations can be set significantly higher than might otherwise be reasonable (e.g., without causing excessive power usage).

For example, consider that the maximum number of iterations at $SINR_{C+}$ may be $K_+$ (e.g., if using the positive stopping criterion only); the average number of iterations at this SINR may also in practice approximate $K_+$. A maximum number of iterations $K_{max}$ (which may be higher than $K_+$) may be configured and one or more negative stopping criteria may be enabled (e.g., in addition to the positive stopping criterion or criteria).

In order to be of use, according to some embodiments, the negative stopping criterion or criteria may be selected to provide some or all of the following characteristics. The negative stopping criterion may not materially degrade the decoding performance at $SINR_{C+}$. The negative stopping criterion may terminate the decoding at $SINR_{C-}$ (and lower SINR, or when coding-rate is too high at an SINR for successful decoding) in a small number of iterations, e.g., on the order of $K_+$. The negative stopping criterion may decrease the code block error rate at $SINR_C$ (and in the critical SINR region) at the expense of a higher average number of iterations. The negative stopping criterion may stand on sound theoretical footing. The negative stopping criterion may be easy to implement (e.g., with respect to resources and power consumption: few gates needed for the criterion calculations; little or no increase in decoding latency).

One possible negative stopping criterion may be an average absolute extrinsic information criterion (AAEXIC). Such a criterion may exhibit all of the desirable properties just described, at least in some instances.

The constituent turbo decoders exchange "information" about the code block bits every half iteration. The exchanged "information" may include the likelihood ratios of the information bits in a code block based on the parity bits processed by the constituent decoder. This "extrinsic information" may be denoted by (computed a priori likelihood ratio) $L_e$, and the $L_e$ exchange between constituent decoders may be referred to as Extrinsic Information Transfer (EXIT).

The AAEXIC may calculate the average of the absolute values of the "extrinsic information" (computed a priori likelihood ratio $L_e$) computed by a constituent decoder in a half-iteration. This will be called AAEXI:

$$\frac{1}{C}\sum_{i=0}^{C-1} |L_e(i)|,$$

where C is the number of (information) bits in the code block.

After each half-iteration, the calculated AAEXI value may be compared to an iteration-dependent threshold and the iterations may be terminated if the AAEXI value is below the threshold.

Generally, turbo decoder implementations may use finite word lengths and the word lengths may be chosen to be just large enough for performance. In such decoder implementations, once the constituent turbo decoders have converged (after successful decoding), the $L_e$ values stabilize. Moreover, in such implementations, the maximum value that AAEXI can achieve can be determined.

One method of determining the maximum value of AAEXI is as follows:

Let the word size for "forward probabilities" α and "backward probabilities" β in the Turbo MAX-LOG-MAP BCJR algorithm described for example tutorially in "From BCJR to Turbo Decoding: MAP algorithms made easier," (incorporated by reference above) be n bits and the input LLR word size be m bits. Then the maximum AAEXI value is:

$$(2^n+2^{m-1})\times s, 0 \le s < 1,$$

where s is the "extrinsic scale" described in "Improving the Max-Log-MAP Turbo Decoder," (incorporated by reference above). Note that the method may vary with the actual decoder implementation and turbo decoding algorithm variant.

For explanatory purposes, the calculated values of AAEXI may be normalized herein such that the possible values range between 0 and approximately 2. Note that such normalization may not be necessary and may be omitted in some embodiments, if desired. With such a normalization, (with very high probability) a successful decode will occur when normalized AAEXI value is greater than 1.

The mutual information I(L; X) between the transmitted bits X and "extrinsic information" L is given in "The EXIT Chart—Introduction to extrinsic information transfer in iterative processing," (incorporated by reference above) as:

$$I(L; X) \approx 1 - EH_b\left(\frac{e^{|L|/2}}{e^{|L|/2} + e^{-|L|/2}}\right),$$

where E is the expectation operator and $H_b$ is the binary entropy function. Noting that the function underlying I(L;X) is a concave function of L, by Jensen's inequality this is upper bounded by $$1 - H_b\left(\frac{e^{E|L|/2}}{e^{E|L|/2} + e^{-E|L|/2}}\right).$$

Figure 6:
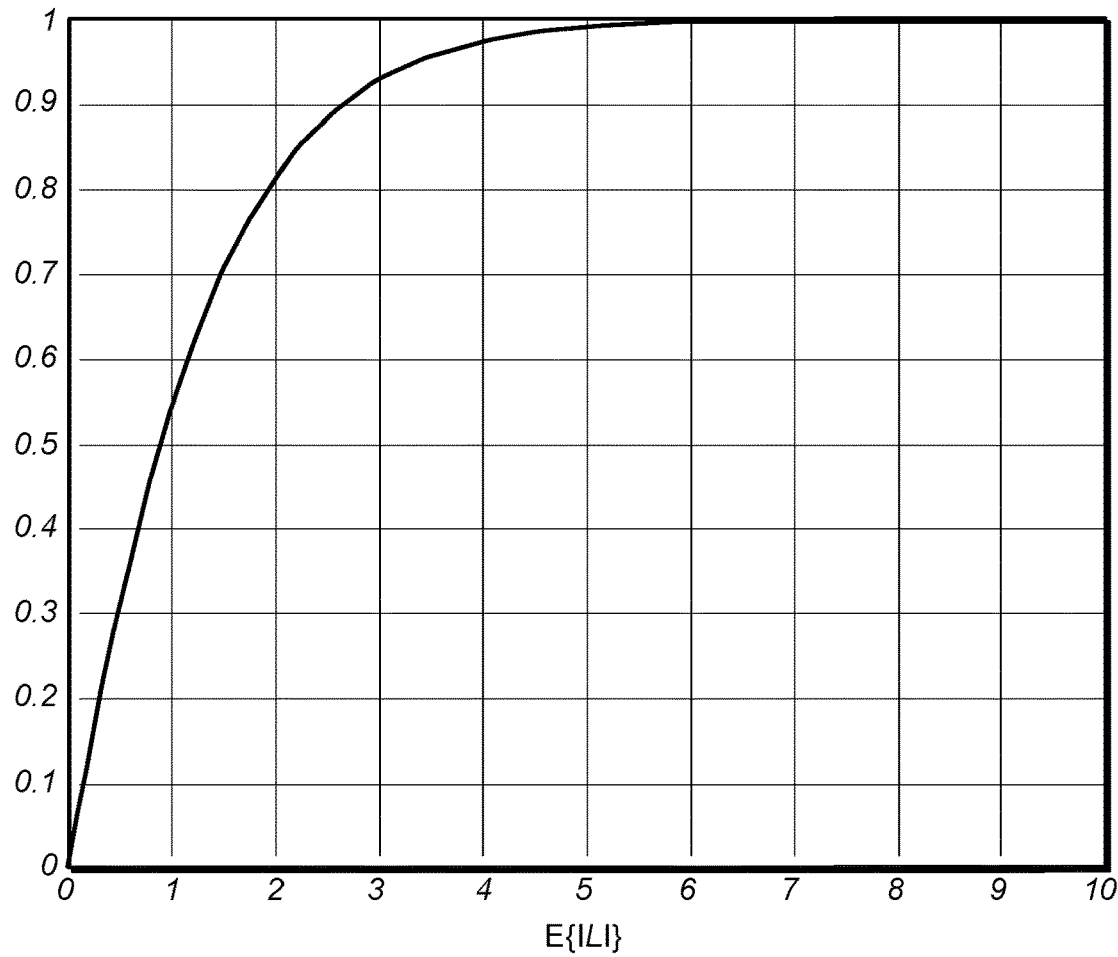
FIG. 6 is a graph illustrating a theoretical upper bound on a mutual information between transmitted information bits X and likelihood ratio L of the bits at the decoder that could be used as part of a turbo decoding technique, according to some embodiments.
Figure 7:
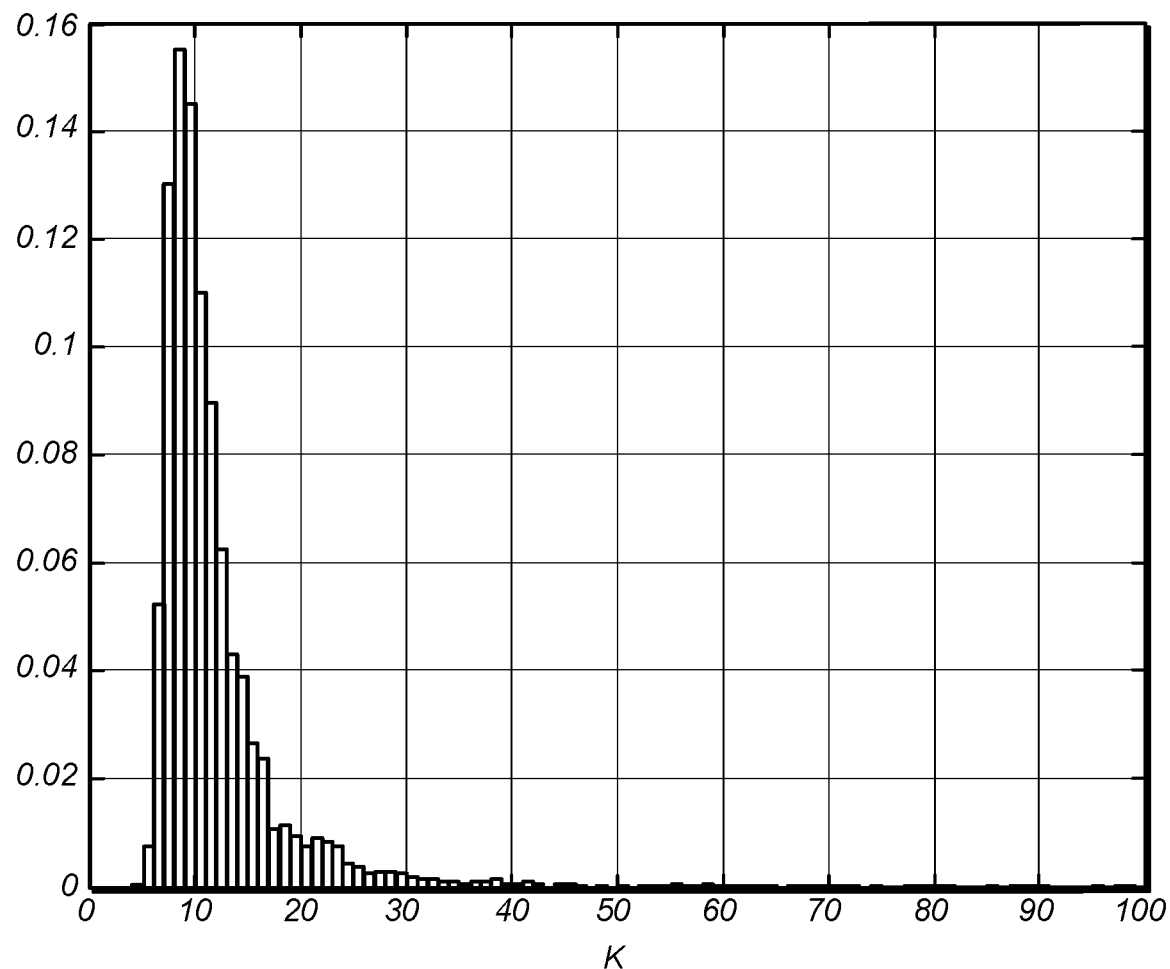
FIG. 7 is a graph of a probability density function (PDF, or more precisely probability mass function) of the number of turbo decoding iterations K for successful decoding of a code block in an illustrative design example, according to some embodiments.

Since the expression above is monotonic in E{|L|}, the average absolute value E{|L|} serves as indicator for the mutual information I(L;X). Thus, assuming ergodicity, it may be reasonable to use AAEXI (which is an average of $|L_e|$ over the bits in a codeword) as the indicator for mutual information. FIG. 6 is a graph illustrating the upper bound on mutual information I(L;X) versus AAEXI.

At least in some embodiments, the implementation of the AAEXIC may be relatively simple since it may include calculating the sum of absolute values of "extrinsic information" being calculated by a constituent decoder. The AAEXIC may be able to process an $L_e$ corresponding to a code block bit as soon as it is produced and thus may not increase the latency of decoding. At least some turbo decoder architectures may not produce $L_e$ in sequence, but this may not have a bearing on the AAEXIC calculation.

Note that any number of similar or equivalent schemes for calculating the average of absolute of $L_e$ in a code block may be used, if desired. Some examples may include approximate schemes, filtering schemes, and running average schemes.

Note that the division by the length "C" of the code block may not be required in the AAEXI calculation. For example, in any given implementation, it may be possible to use any convenient scaling along with the appropriate scaling of thresholds used in the stopping criteria.

Since the $L_e$ may not be produced in sequence by a Turbo decoder, it may be the case that the CRC calculation does not start until a half-iteration is complete and all the $L_e$ corresponding to the codeblock bits have been found. Since AAEXI gives an indication of the convergence of the Turbo decoding, the CRC calculation may not need to be run every half iteration. For example, the CRC calculations can be run instead when the normalized AAEXI value exceeds unity in this example implementation (in practice this may be generalized to when AAEXI exceeds a decoder implementation dependent threshold). In this sense the AAEXIC can also function as (or aid) the 'positive stopping criterion.'

Thus, AAEXIC may be relatively easy to implement.

For explanatory purposes, one possible process for configuring an AAEXI based negative stopping criterion may be illustrated using an example. The critical SINR region ($SINR_C$) for a 3GPP Turbo code of length 6144 at rate 1/3 on a given finite-word length turbo decoder implementation may first be identified. A scenario with the maximum number of iterations of 100 with only the 'positive stopping criterion' at an SINR in the critical region may then be simulated. As an example, the block error rate might be 5%, and the average number of iterations might be 17.95. This example scenario may be referred to as "P-100". While in such a simulation the average number of iterations K may be 17.95, for the successful decodes, the average number of iterations may be 13.4 with the probability density function (PDF) of K (for successful decodes) shown in FIG. 7.

Figure 8:
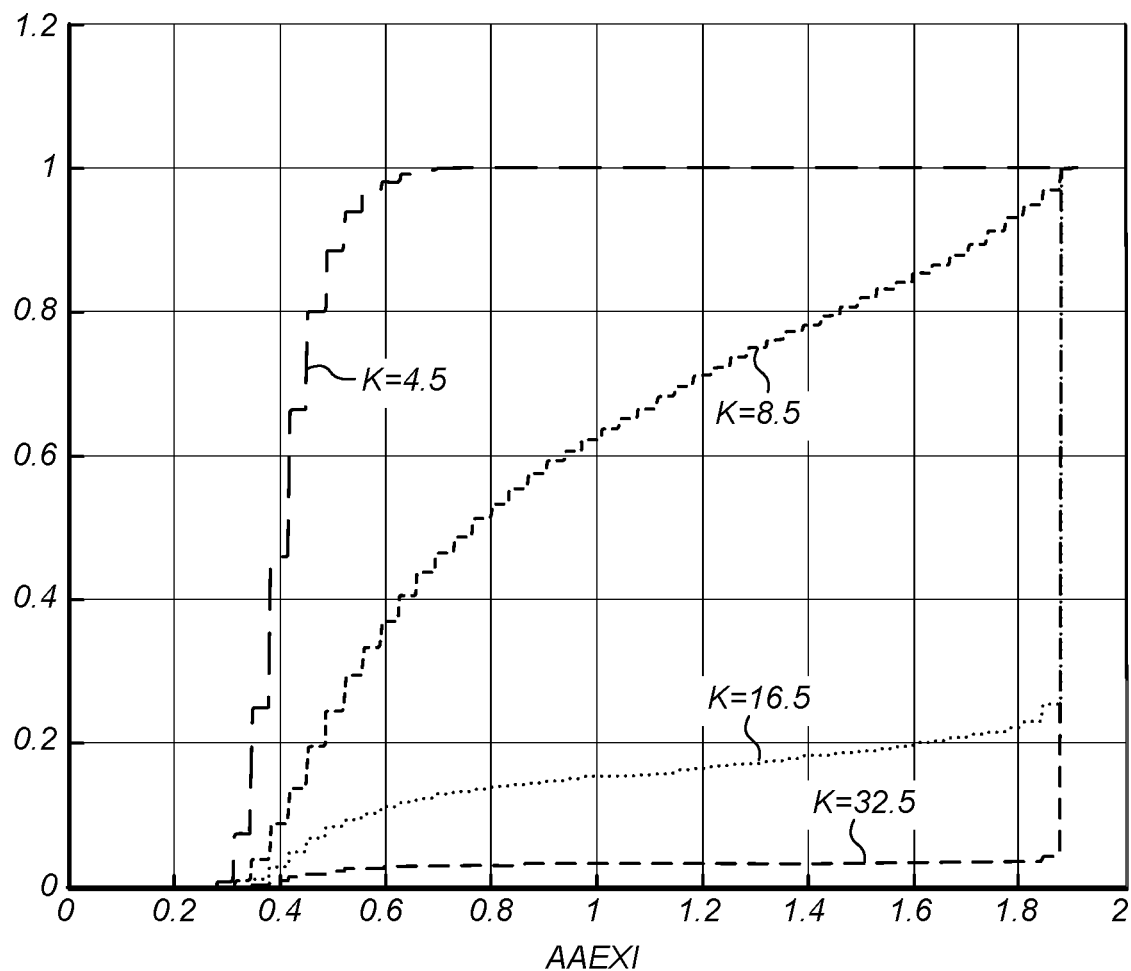
FIGS. 8-9 are graphs of cumulative distribution function (CDF) of a metric that may be used as part of a negative stopping criterion for turbo decoding based on the illustrative design example of FIG. 7, according to some embodiments.

The AAEXI value was earlier defined according to one implementation as the average of absolute values of the "extrinsic information," $|L_e|$, over the code block bits. FIG. 8 illustrates the cumulative distribution function (CDF) of the AAEXI at $SINR_C$ shown at different iterations 'K=k' for the cases where the decode was successful in up to 100 iterations (e.g., according to the previously described simulation). Note that unsuccessful decodes are not included in FIG. 8, and that the "k=4.5" in the figure means four full turbo iterations and one half iteration.

As previously mentioned, for explanatory purposes, the AAEXI values have been normalized for the finite-word-length decoder implementation so that the values lie between 0 and approximately 2. When the AAEXI value has gotten close to 2, the decoding may be correct with very high probability. When the value is less than 1, the decoder may have not yet converged. At the iteration when a successful decode occurs (for the first time), the value of AAEXI may generally (or possibly always) be between 1 and 2.

Figure 9:
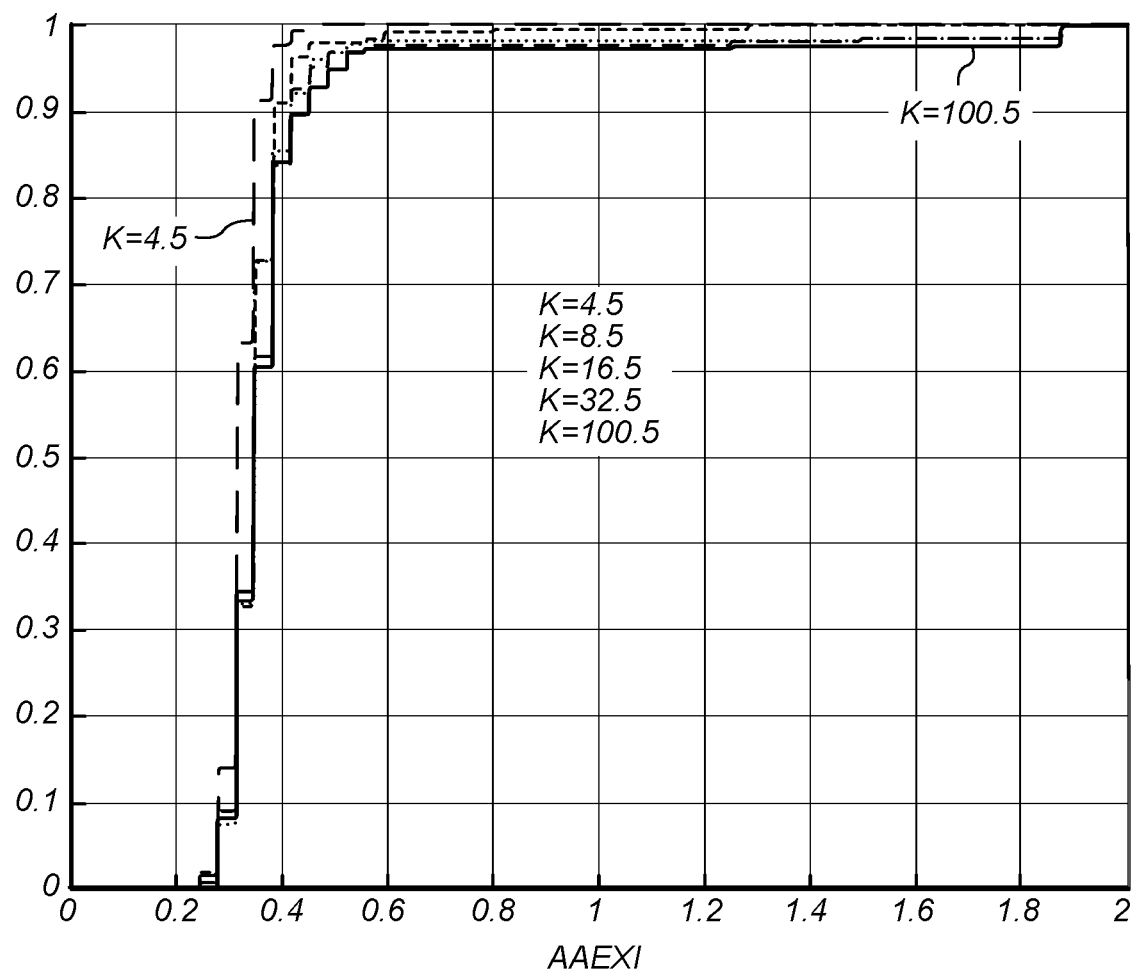

Similarly, FIG. 9 illustrates the CDF of the AAEXI at $SINR_C$ at different iterations 'K=k' for the cases where the decode was unsuccessful in 100 iterations.

Note that while this example is phrased in terms of termination after a full turbo iteration, the method may also be applicable when the termination decision is made every half-iteration. Since the decision is made every full iteration in this example, the "0.5" appears in K values.

From the CDF of AAEXI for successful decodes in maximum of 100 iterations (illustrated in FIG. 8), for each iteration, the 30th percentile AAEXI value may be determined. These 30th percentile AAEXI values are plotted in FIG. 10 for each iteration K. Thus, for a given iteration K, 70% of the eventual successful candidates may have a value of AAEXI at least as high as the threshold plotted in FIG. 10.

Figure 10:
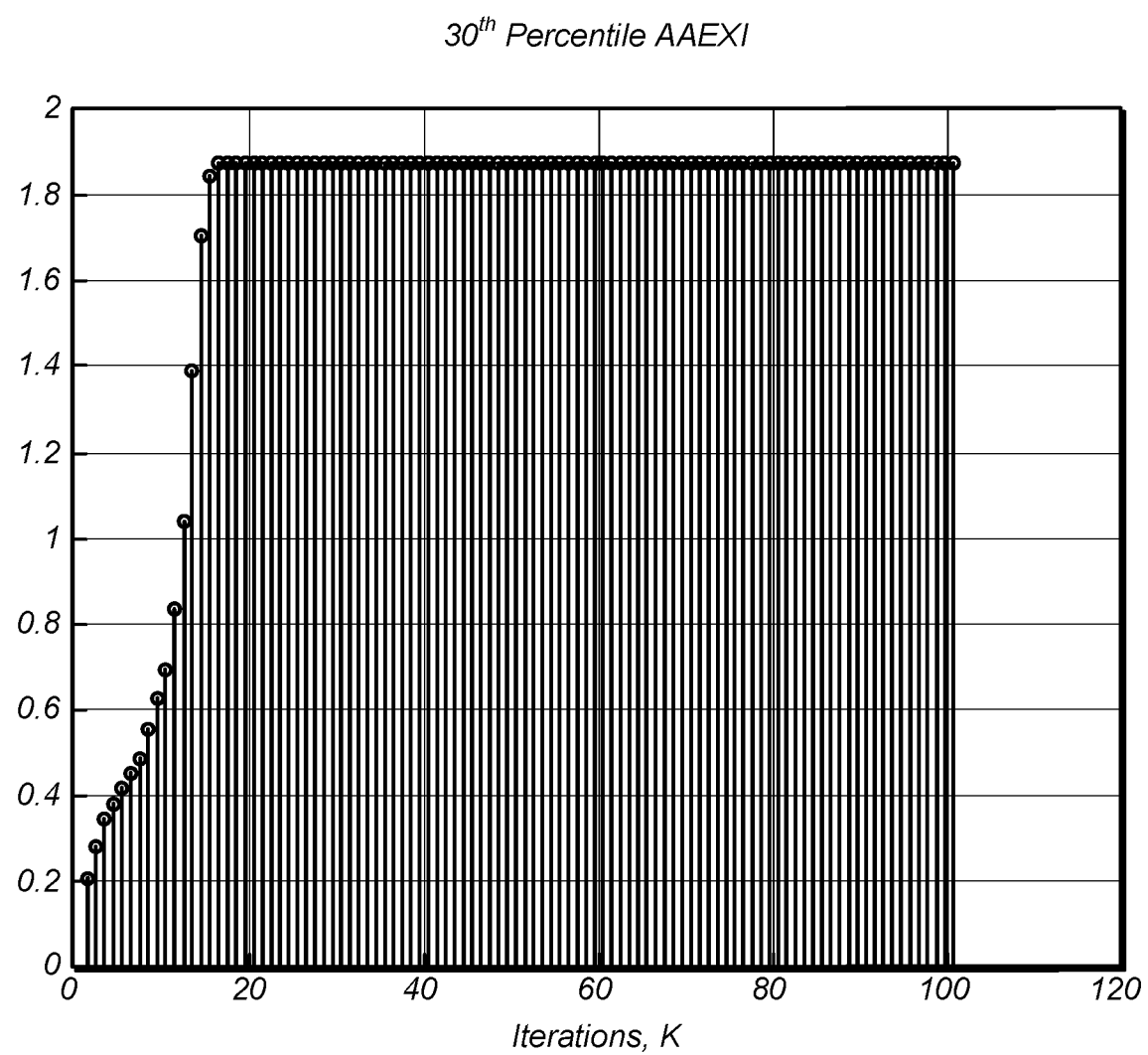
FIG. 10 shows the $30^{th}$ percentile of the metric in FIG. 8 that may be used as part of a negative stopping criterion for turbo decoding based on the illustrative design example of FIG. 7, according to some embodiments.

Considering the 30th percentile AAEXI values illustrated in FIG. 10 and the CDFs of AAEXI illustrated in FIGS. 8-9, several AAEXIC stopping criterion choices are possible. As an example, one possible set of stopping rules that include negative stopping criteria and for which performance can be simulated includes the following:

Maximum Iterations=16.5. At maximum iteration, always terminate.
POSITIVE STOPPING CRITERION: At iteration K, IF (decoding successful) THEN terminate
NEGATIVE STOPPING CRITERION: IF ((iteration K>4.5) AND (AAXEI<0.38)) OR ((iteration K>6.5) AND (AAXEI<0.42)) THEN terminate This stopping rule may be referred to herein as "P-N-K" (or "P-N-16" for maximum K=16). For comparison purposes, performance can also be simulated for a set of stopping rules referred to as "P-K" in which:

Positive stopping criterion enabled, and
K=maximum iterations, (e.g., P-16 denotes K=16).

Likewise for comparison purposes, performance can also be simulated for a set of stopping rules referred to as "P-N-K" in which:

Positive stopping criterion enabled,
Negative stooping criterion enabled, and
K=maximum iterations.

FIG. 11 includes performance results for simulations using these example stopping rules and illustrate the possible performance of AAEXIC according to one example scenario. The first table represents results from a simulation run at $SINR_{C+}$ (high SINR region), while the second table represents results from a simulation run at $SINR_C$ (in the critical region), and the third table represents results from a simulation run at $SINR_{C-}$ (low SINR region), with $K_+$=5 and $K_-$=16. P-100 is also shown in the second table ($SINR_C$) for reference. The acronym BLER denotes the code block error rate.

The comparison of P-N-16 can be made with the "standard" P-5. At low SINR (e.g., as illustrated in the third table 1106), both P-5 and P-N-16 take the same number of iterations.

At high SINR (e.g., as illustrated in the first table 1102), the average number of iterations is the same, but P-N-16 exhibits a BLER that is practically equivalent to P-16. At the critical SINR (e.g., as illustrated in the second table 1104), the P-5 fails completely (BLER=100%), while P-N-16 has a respectable success rate that is slightly worse than that of P-16 but exhibits a lower average number of iterations.

These simulations may be considered as evidence that AAEXIC may not degrade decoding performance at $SINR_{C+}$, may terminate the decoding at $SINR_{C-}$ in a small number of iterations, and may decrease the code block error rate at $SINR_C$ at the expense of a higher average number of iterations.

Thus, AAEXIC may provide all of the characteristics previously noted and may provide a viable negative stopping criterion for turbo decoding. As previously noted, while the example describes one possible design based on AAEXI for illustration, it should be reiterated that other designs are possible. Additionally, note that it may be possible to apply the AAEXIC stopping criterion in other detection/decoding problems which use the "turbo principle" (some of which are mentioned in "The EXIT Chart—Introduction to extrinsic information transfer in iterative processing" (incorporated by reference above)).

Note that since AAEXIC is based on averaging extrinsic information across the codeblock bits, the AAEXI metric may not be as reliable for very short codeblocks. However, at least in some instances short code blocks may have light turbo decoding requirements.

In the following further exemplary embodiments are provided.

One set of embodiments may include a wireless user equipment (UE) device, comprising: a radio; a processing element coupled to the radio; wherein the radio and the processing element are configured to: wirelessly receive turbo coded data; perform turbo decoding on the turbo coded data, wherein performing turbo decoding uses one or more negative stopping criteria for early termination of the turbo decoding for each code block of the turbo coded data, wherein the one or more negative stopping criteria are selected to terminate the turbo decoding of a code block early under poor wireless medium conditions; and terminate the turbo decoding of a code block early if the one or more negative stopping criteria for the code block are met.

One set of embodiments may include a wireless base station (BS) device, comprising: a radio; a processing element coupled to the radio; wherein the radio and the processing element are configured to: wirelessly receive turbo coded data; perform turbo decoding on the turbo coded data, wherein performing turbo decoding uses one or more negative stopping criteria for early termination of the turbo decoding for each code block of the turbo coded data, wherein the one or more negative stopping criteria are selected to terminate the turbo decoding of a code block early under poor wireless medium conditions; and terminate the turbo decoding of a code block early if the one or more negative stopping criteria for the code block are met.

According to some embodiments, the one or more negative stopping criteria are based at least in part on computed a priori likelihood ratios of information bits of the turbo coded data.

According to some embodiments, a first negative stopping criterion of the one or more negative stopping criteria comprises a metric being below a first threshold after a first number of turbo decoding iterations.

According to some embodiments, a second negative stopping criterion of the one or more negative stopping criteria comprises the metric being below a second threshold after a second number of turbo decoding iterations.

According to some embodiments, a negative stopping criterion of the one or more negative stopping criteria comprises the metric being below a variable threshold at each turbo decoding iteration.

According to some embodiments, a negative stopping criterion of the one or more negative stopping criteria comprises the metric at each turbo decoding iteration being below or equal to the value of the metric at the preceding turbo decoding iteration, starting at some iteration.

According to some embodiments, a negative stopping criterion of the one or more negative stopping criteria comprises the metric at each turbo decoding iteration being below or equal to the value of the metric at the preceding turbo decoding iteration, for selected iterations.

According to some embodiments, the metric comprises average absolute extrinsic information (AAEXI), wherein the AAEXI is defined as:

$$\frac{1}{C}\sum_{i=0}^{C-1}|L_e(i)|,$$

wherein C comprises a number of bits in a code block, wherein $L_e$ comprises a likelihood ratio of an information bit in a code block as computed by a constituent turbo decoder and used as a priori likelihood ratio of the information bit by the other constituent turbo decoder in its next iteration.

According to some embodiments, performing turbo decoding also uses a maximum duration for performing turbo decoding for each code block of the turbo coded data, wherein turbo decoding of a code block is terminated if the maximum duration for performing turbo coding is met for the code block.

According to some embodiments, the one or more negative stopping criteria and the maximum duration for performing turbo decoding for each code block of the turbo coded data are selected to cause turbo decoding of a code block received in wireless medium conditions corresponding to a first signal to interference plus noise (SINR) range to terminate earlier than turbo decoding of a code block received in wireless medium conditions corresponding to a second SINR range, wherein the first SINR range comprises lower SINR values than the second SINR range.

According to some embodiments, performing turbo decoding also uses one or more positive stopping criteria for early termination of the turbo decoding for each code block of the turbo coded data, wherein a first positive stopping criterion comprises an appended cyclic redundancy check value of a code block successfully checking against a cyclic redundancy check value calculated from decoded information bits of the code block.

According to some embodiments, the radio and the processing element are further configured to: monitor a metric that is based at least in part on computed a priori likelihood ratios of information bits of the turbo coded data; and select when to check whether a positive stopping criterion is met based at least in part on a value of the metric.

According to some embodiments, the one or more negative stopping criteria are selected based at least in part on design characteristics of the UE device.

A further set of embodiments may include a method, comprising: by a wireless user equipment (UE) device: wirelessly receiving a code block of turbo coded data; performing turbo decoding of the code block of turbo coded data for up to a predetermined maximum duration; and determining whether any of one or more positive stopping criteria or one or more negative stopping criteria for the turbo decoding have been met prior to the predetermined maximum duration, wherein the turbo decoding of the code block of turbo coded data is stopped upon meeting a positive stopping criterion, a negative stopping criterion, or the predetermined maximum duration, wherein the one or more positive stopping criteria, the one or more negative stopping criteria, and the predetermined maximum duration are configured to cause a duration of the turbo decoding of the code block to vary in a manner correlated with wireless medium conditions when receiving the code block of turbo coded data.

According to some embodiments, the one or more positive stopping criteria, the one or more negative stopping criteria, and the predetermined maximum duration are configured to cause on average the duration of the turbo decoding of the code block to be shorter in poor and good wireless medium conditions than in moderate medium conditions.

According to some embodiments, the poor wireless medium conditions comprise a signal to interference to noise (SINR) region below a first threshold, wherein the good wireless medium conditions comprise a SINR region above a second threshold, wherein the moderate wireless medium conditions comprise a SINR region between the first threshold and the second threshold.

According to some embodiments, the predetermined maximum duration comprises a predetermined maximum number of turbo decoding iterations.

According to some embodiments, the one or more negative stopping criteria comprise a metric associated with probability of eventual successful decoding of turbo coded data being below a predetermined threshold at a predetermined turbo coding iteration.

According to some embodiments, the one or more negative stopping criteria comprise a metric associated with probability of eventual successful decoding of turbo coded data being lower or equal to the value of the metric at preceding turbo coding iteration.

According to some embodiments, the one or more positive stopping criteria comprise decoded information bits of the code block meeting a cyclic redundancy check for the code block.

According to some embodiments, the method further comprises: wirelessly receiving a plurality of additional code blocks of turbo coded data; and performing turbo decoding of each of the plurality of additional code blocks of turbo coded data.

Yet another set of embodiments may include a method, comprising: by a turbo decoding module of a wireless user equipment (UE) device or a base station equipment (BS): receiving a plurality of code blocks of turbo coded data; performing turbo decoding of each code block of the plurality of code blocks of turbo coded data, comprising performing up to a predetermined maximum number of turbo decoding iterations on each code block; and determining, for each code block, whether any positive or negative stopping criteria have been met, wherein turbo decoding of a code block of turbo coded data is stopped upon meeting a positive stopping criterion, a negative stopping criterion, or the predetermined maximum number of turbo decoding iterations, wherein the negative stopping criteria and the predetermined maximum number of turbo decoding iterations are configured to cause turbo decoding of a code block to have a shorter duration if the UE is experiencing signal to interference plus noise (SINR) in a first range of SINR values than in a second range of SINR values, wherein the first range of SINR values is lower than the second range of SINR values.

According to some embodiments, the one or more positive stopping criteria and the predetermined maximum number of turbo coding iterations are configured to cause the turbo decoding to have a shorter duration if the UE is experiencing SINR in a third range of SINR values than in the second range of SINR values, wherein the third range of SINR values is higher than the second range of SINR values.

According to some embodiments, the negative stopping criteria are selected to cause stopping of turbo decoding of a code block if probability of successful decoding of the code block is deemed below a predetermined threshold.

According to some embodiments, the negative stopping criteria are based at least in part on comparing a value of a metric with one or more threshold values, wherein the metric is calculated based on 'computed a priori likelihood ratios' of information bits in a code block exchanged between constituent turbo decoders of the turbo decoding module.

Yet another exemplary embodiment may include a wireless device, comprising: a radio; and a processing element operably coupled to the radio, wherein the processing element and the radio are configured to implement any or all parts of the preceding examples.

A further exemplary set of embodiments may include a non-transitory computer accessible memory medium comprising program instructions which, when executed at a device, cause the device to implement any or all parts of any of the preceding examples.

A still further exemplary set of embodiments may include a computer program comprising instructions for performing any or all parts of any of the preceding examples.

Yet another exemplary set of embodiments may include an apparatus comprising means for performing any or all of the elements of any of the preceding examples.

Embodiments of the present disclosure may be realized in any of various forms. For example some embodiments may be realized as a computer-implemented method, a computer-readable memory medium, or a computer system. Other embodiments may be realized using one or more custom-designed hardware devices such as ASICs. Still other embodiments may be realized using one or more programmable hardware elements such as FPGAs.

In some embodiments, a non-transitory computer-readable memory medium may be configured so that it stores program instructions and/or data, where the program instructions, if executed by a computer system, cause the computer system to perform a method, e.g., any of a method embodiments described herein, or, any combination of the method embodiments described herein, or, any subset of any of the method embodiments described herein, or, any combination of such subsets.

In some embodiments, a device (e.g., a UE 106) may be configured to include a processor (or a set of processors) and a memory medium, where the memory medium stores program instructions, where the processor is configured to read and execute the program instructions from the memory medium, where the program instructions are executable to implement any of the various method embodiments described herein (or, any combination of the method embodiments described herein, or, any subset of any of the method embodiments described herein, or, any combination of such subsets). The device may be realized in any of various forms.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A wireless device, comprising:
a radio;
a processing element coupled to the radio;
wherein the radio and the processing element are configured to:
wirelessly receive turbo coded data;
perform turbo decoding on the turbo coded data, wherein performing turbo decoding uses one or more negative stopping criteria for early termination of unsuccessful turbo decoding for each code block of the turbo coded data, wherein the one or more negative stopping criteria are selected to terminate the unsuccessful turbo decoding of a code block early under poor wireless medium conditions, wherein the one or more negative stopping criteria are based at least in part on computed a priori likelihood ratios of information bits of the turbo coded data; and
terminate the unsuccessful turbo decoding of a code block early if the one or more negative stopping criteria for the code block are met.

2. The wireless device of claim 1,
wherein a first negative stopping criterion comprises a value of a metric being below a first threshold after a first number of turbo decoding iterations.

3. The wireless device of claim 2, wherein a second negative stopping criterion comprises the value of the metric being below a second threshold after a second number of turbo decoding iterations.

4. The wireless device of claim 1, wherein a negative stopping criterion of the one or more negative stopping criteria comprises a value of a metric being below a variable threshold at a turbo decoding iteration, wherein the variable threshold is a function of the turbo decoding iteration.

5. The wireless device of claim 1, wherein a negative stopping criterion of the one or more negative stopping criteria comprises a value of a metric at a turbo decoding iteration being below or equal to the value of the metric at a preceding turbo decoding iteration, for any turbo decoding iteration starting at a predetermined turbo decoding iteration.

6. The wireless device of claim 1, wherein a negative stopping criterion of the one or more negative stopping criteria comprises a value of a metric at a turbo decoding iteration being below or equal to the value of the metric at a preceding turbo decoding iteration, for any of a selected subset of turbo decoding iterations.

7. The wireless device of claim 1,
wherein the one or more negative stopping criteria are based at least in part on an average absolute extrinsic information (AAEXI) metric, wherein the AAEXI metric is defined as:

$$\frac{1}{C}\sum_{i=0}^{C-1} |L_e(i)|,$$

wherein C comprises a number of bits in a code block,
wherein $L_e$ comprises a likelihood ratio of an information bit in a code block as computed by a constituent turbo decoder and used as a priori likelihood ratio of the information bit by the other constituent turbo decoder in its next iteration.

8. The wireless device of claim 1,
wherein performing turbo decoding also uses one or more positive stopping criteria for early termination of the turbo decoding for each code block of the turbo coded data, wherein a first positive stopping criterion comprises an appended cyclic redundancy check value of a code block successfully checking against a cyclic redundancy check value calculated from decoded information bits of the code block.

9. The wireless device of claim 1, wherein the radio and the processing element are further configured to:
monitor a metric that is based at least in part on computed a priori likelihood ratios of information bits of the turbo coded data; and
select when to check whether a positive stopping criterion is met based at least in part on a value of the metric.

10. The wireless device of claim 1,
wherein the one or more negative stopping criteria are selected based at least in part on design characteristics of one or more of the wireless device or a wireless device from which the turbo coded data was received.

11. An apparatus, comprising a processing element configured to cause a wireless device to:
wirelessly receive a code block of turbo coded data;
performing turbo decoding of the code block of turbo coded data for up to a predetermined maximum duration;
determine whether any of one or more positive stopping criteria or one or more negative stopping criteria for the turbo decoding have been met prior to the predetermined maximum duration,
wherein the turbo decoding of the code block of turbo coded data is stopped upon meeting a positive stopping criterion, a negative stopping criterion, or the predetermined maximum duration,
wherein the one or more positive stopping criteria, the one or more negative stopping criteria, and the predetermined maximum duration are configured to cause a duration of the turbo decoding of the code block to vary in a manner correlated with wireless medium conditions when receiving the code block of turbo coded data, and
in response to one or more negative stopping criteria being met, terminate turbo decoding without successfully decoding the turbo coded data.

12. The apparatus of claim 11,
wherein the one or more positive stopping criteria, the one or more negative stopping criteria, and the predetermined maximum duration are configured to cause the duration of the turbo decoding of the code block to be shorter in poor and good wireless medium conditions than in moderate medium conditions,
wherein the poor wireless medium conditions comprise a signal to interference to noise (SINR) region below a first threshold,
wherein the good wireless medium conditions comprise a SINR region above a second threshold,
wherein the moderate wireless medium conditions comprise a SINR region between the first threshold and the second threshold.

13. The apparatus of claim 11,
wherein the predetermined maximum duration is selected based at least in part on a device class of a device from which the code block of turbo coded data is received,
wherein a higher predetermined maximum duration is selected when the device class of the device from which the code block of turbo coded data comprises a link budget limited device class than when the device class of the device from which the code block of turbo coded data comprises a non link budget limited device class.

14. The apparatus of claim 11,
wherein the predetermined maximum duration is selected based at least in part on wireless medium conditions between the wireless device and the device from which the code block of turbo coded data is received,
wherein a higher predetermined maximum duration is selected when the wireless medium conditions are poor than when the wireless medium conditions are good.

15. The apparatus of claim 11,
wherein the one or more negative stopping criteria comprise a metric associated with probability of eventual successful decoding of turbo coded data being below a predetermined threshold at a predetermined turbo coding iteration.

16. The apparatus of claim 11, wherein the processing element is further configured to cause the wireless device to:
wirelessly receive a plurality of additional code blocks of turbo coded data; and
perform turbo decoding of each of the plurality of additional code blocks of turbo coded data.

17. A method, comprising:
by a turbo decoding module of a wireless device:
receiving a plurality of code blocks of turbo coded data;
performing turbo decoding of each code block of the plurality of code blocks of turbo coded data, comprising performing up to a predetermined maximum number of turbo decoding iterations on each code block; and
determining, for each code block, whether any positive or negative stopping criteria have been met,
wherein turbo decoding of a respective code block of turbo coded data is stopped upon meeting a positive stopping criterion, a negative stopping criterion, or the predetermined maximum number of turbo decoding iterations,
wherein the negative stopping criteria and the predetermined maximum number of turbo decoding iterations are configured to cause turbo decoding of a code block to have a shorter duration if the wireless device is experiencing signal to interference plus noise ratio (SINR) in a first range of SINR values than if the wireless device is experiencing SINR in a second range of SINR values, wherein the first range of SINR values is lower than the second range of SINR values, and
in response to a negative stopping criteria being met, stop turbo decoding of the respective code block of turbo coded data without successfully decoding the respective code block of turbo coded data.

18. The method of claim 17,
wherein the positive stopping criterion and the predetermined maximum number of turbo coding iterations are configured to cause the turbo decoding to have a shorter duration if the wireless device is experiencing SINR in a third range of SINR values than if the communication device is experiencing SINR in the second range of SINR values, wherein the third range of SINR values is higher than the second range of SINR values.

19. The method of claim 17,
wherein the negative stopping criteria are selected to cause stopping of turbo decoding of a code block if probability of successful decoding of the code block is deemed below a predetermined threshold.

20. The method of claim 17,
wherein the negative stopping criteria are based at least in part on comparing a value of a metric with one or more threshold values, wherein the metric is calculated based on computed a priori likelihood ratios of information bits in a code block exchanged between constituent turbo decoders of the turbo decoding module.

* * * * *